(12) United States Patent
Kang et al.

(10) Patent No.: US 11,894,310 B2
(45) Date of Patent: Feb. 6, 2024

(54) FAN-OUT SEMICONDUCTOR PACKAGE

(71) Applicant: SAMSUNG ELECTRONICS CO., LTD., Suwon-si (KR)

(72) Inventors: Myung Sam Kang, Hwaseong-si (KR); Ki Ju Lee, Seoul (KR); Young Chan Ko, Seoul (KR); Jeong Seok Kim, Cheonan-si (KR); Bong Ju Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 397 days.

(21) Appl. No.: 17/194,438

(22) Filed: Mar. 8, 2021

(65) Prior Publication Data

US 2022/0037259 A1 Feb. 3, 2022

(30) Foreign Application Priority Data

Jul. 29, 2020 (KR) .................. 10-2020-0094148

(51) Int. Cl.
*H01L 23/538* (2006.01)
*H01L 23/31* (2006.01)
(Continued)

(52) U.S. Cl.
CPC ...... *H01L 23/5389* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/367* (2013.01); *H01L 23/5383* (2013.01); *H01L 23/5386* (2013.01); *H01L 23/552* (2013.01); *H01L 24/19* (2013.01); *H01L 24/20* (2013.01); *H01L 2221/68372* (2013.01); *H01L 2224/214* (2013.01); *H01L 2924/3025* (2013.01)

(58) Field of Classification Search
CPC ............. H01L 23/5389; H01L 21/4853; H01L 21/4857; H01L 21/565; H01L 21/568; H01L 21/6835; H01L 23/3128; H01L 23/367; H01L 23/5383; H01L 23/5386; H01L 23/552; H01L 24/19; H01L 24/20; H01L 2221/68372; H01L 2224/214; H01L 2924/3025
See application file for complete search history.

(56) References Cited

U.S. PATENT DOCUMENTS 9,508,674 B2 11/2016 Pan et al.
10,037,961 B2 7/2018 Chiu et al.
(Continued)

*Primary Examiner* — Fernando L Toledo
*Assistant Examiner* — Neil R Prasad
(74) *Attorney, Agent, or Firm* — Muir Patent Law, PLLC

(57) ABSTRACT

A fan-out semiconductor package including a first redistribution layer; a first semiconductor chip on the first redistribution layer; an interconnector on the first redistribution layer and spaced apart from the first semiconductor chip; a molded layer covering the interconnector and side surfaces of the first semiconductor chip; and a second redistribution layer on the molded layer, wherein the interconnector includes a metal ball and is electrically connected to the first redistribution layer, the second redistribution layer includes a first line wiring, and a first via electrically connected to the first line wiring, the first via is connected to the interconnector, and a part of the first via is in the molded layer.

16 Claims, 28 Drawing Sheets

(51) Int. Cl.
*H01L 23/552* (2006.01)
*H01L 23/00* (2006.01)
*H01L 21/48* (2006.01)
*H01L 21/56* (2006.01)
*H01L 21/683* (2006.01)
*H01L 23/367* (2006.01)

(56) References Cited

U.S. PATENT DOCUMENTS

| | | |
|---|---|---|
| 10,068,844 B2 | 9/2018 | Chiu et al. |
| 10,157,835 B2 | 12/2018 | Yu et al. |
| 10,163,852 B2 | 12/2018 | Yu et al. |
| 10,170,341 B1 | 1/2019 | Lin et al. |
| 10,269,587 B2 | 4/2019 | Lin et al. |
| 10,566,289 B2 | 2/2020 | Lee et al. |
| 2013/0341784 A1* | 12/2013 | Lin .................. H01L 21/78 257/737 |
| 2016/0260693 A1* | 9/2016 | Lin .................. H01L 25/16 |
| 2017/0287865 A1* | 10/2017 | Yu .................. H01L 24/81 |
| 2018/0301420 A1* | 10/2018 | Kim ............. H01L 21/4885 |
| 2018/0358288 A1* | 12/2018 | Lee ................. H01L 24/20 |
| 2020/0303806 A1* | 9/2020 | Wu ................ H01L 23/552 |

\* cited by examiner

FAN-OUT SEMICONDUCTOR PACKAGE

CROSS-REFERENCE TO RELATED APPLICATION

Korean Patent Application No. 10-2020-0094148, filed on Jul. 29, 2020, in the Korean Intellectual Property Office, and entitled: "Fan-Out Semiconductor Package," is incorporated by reference herein in its entirety.

BACKGROUND

1. Field

Embodiments relate to a fan-out semiconductor package.

2. Description of the Related Art

As a high-performance element implementation is desired, a semiconductor chip size has increased and a semiconductor package size has increased accordingly. The thickness of semiconductor packages has rather decreased due to slimness trend of electronic devices.

A semiconductor package has been developed in view of satisfying the demands for multi-functionality, high capacity and miniaturization. Therefore, by integrating a plurality of semiconductor chips in a single semiconductor package, it is possible to perform the high capacity and multi-functionality, while significantly reducing the size of the semiconductor package.

A major trend of technological development related to semiconductor chips is to reduce the size of components, and in the package field, a large number of pins may be implemented while having a small size in accordance with a rapid increase in demand for small semiconductor chips and the like.

SUMMARY

The embodiments may be realized by providing a fan-out semiconductor package including a first redistribution layer; a first semiconductor chip on the first redistribution layer; an interconnector on the first redistribution layer and spaced apart from the first semiconductor chip; a molded layer covering the interconnector and side surfaces of the first semiconductor chip; and a second redistribution layer on the molded layer, wherein the interconnector includes a metal ball and is electrically connected to the first redistribution layer, the second redistribution layer includes a first line wiring, and a first via electrically connected to the first line wiring, the first via is connected to the interconnector, and a part of the first via is in the molded layer.

The embodiments may be realized by providing a fan-out semiconductor package including a molded layer including first and second surfaces opposite to each other; an interconnector in the molded layer, the interconnector including a metal ball; a semiconductor chip in the molded layer and spaced apart from the interconnector; a first redistribution layer including a first line wiring and a first via on the first surface of the molded layer; and a second redistribution layer on the second surface of the molded layer and including a second line wiring and a second via, wherein the interconnector is between the first via and the second via and connected to the first via and the second via.

The embodiments may be realized by providing a fan-out semiconductor package including a first redistribution layer including a first line wiring and a first via connected to the first line wiring; a first semiconductor chip on the first redistribution layer; an interconnector on the first redistribution layer and spaced apart from the first semiconductor chip; a molded layer covering the interconnector and covering side surfaces of the first semiconductor chip; a second redistribution layer on the molded layer, the second redistribution layer including a second line wiring and a second via connected to the second line wiring; and a semiconductor package that includes a second semiconductor chip on the second redistribution layer and connected to the second line wiring, wherein the interconnector includes a metal ball, the first via is in contact with the interconnector, the second via is in contact with the interconnector, a part of the second via is inside the molded layer, and the first semiconductor chip is electrically connected to the second semiconductor chip through the first line wiring, the first via, the interconnector, the second via, and the second line wiring.

BRIEF DESCRIPTION OF THE DRAWINGS

Features will be apparent to those of skill in the art by describing in detail exemplary embodiments with reference to the attached drawings in which.

DETAILED DESCRIPTION

An electronic device 1 including a semiconductor package 100 including an interconnector 300 will be described below referring to FIGS. 1 to 5.

Figure 1:
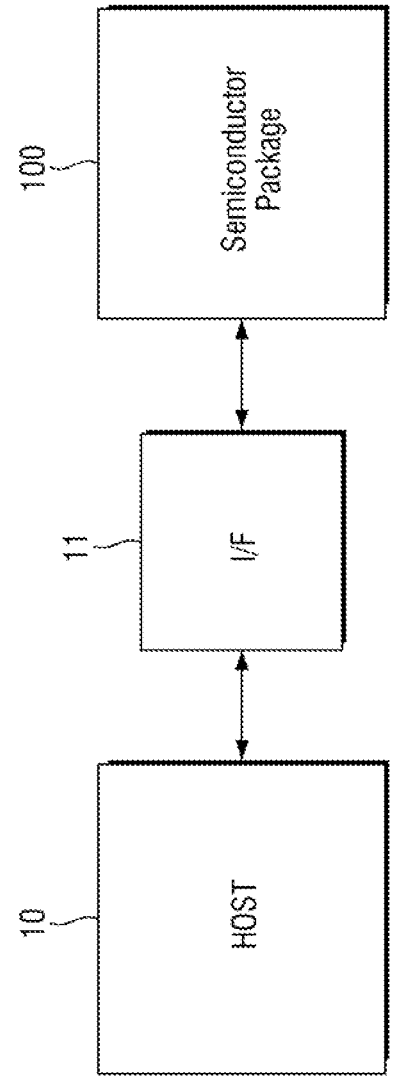
FIGS. 1 and 2 illustrate an electronic device according to some embodiments of the present disclosure.
Figure 2:
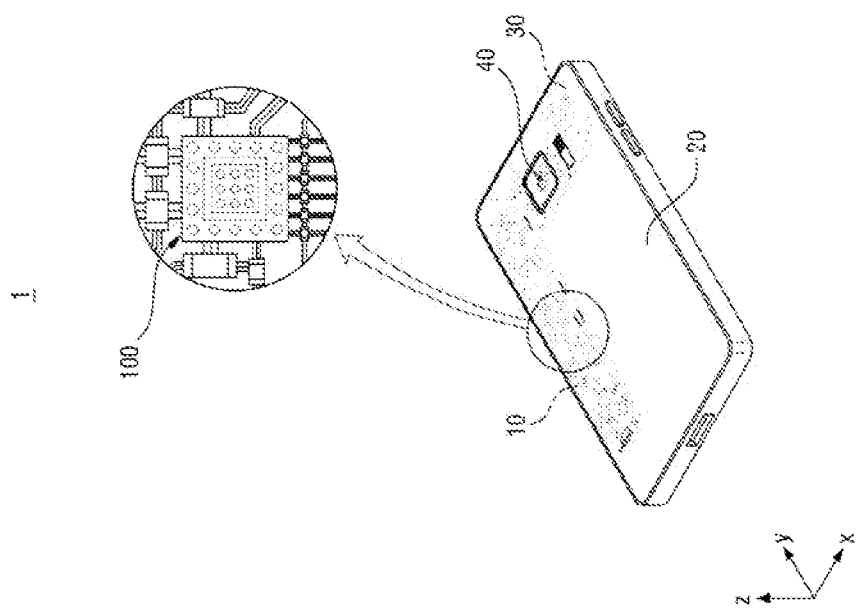
Figure 3:
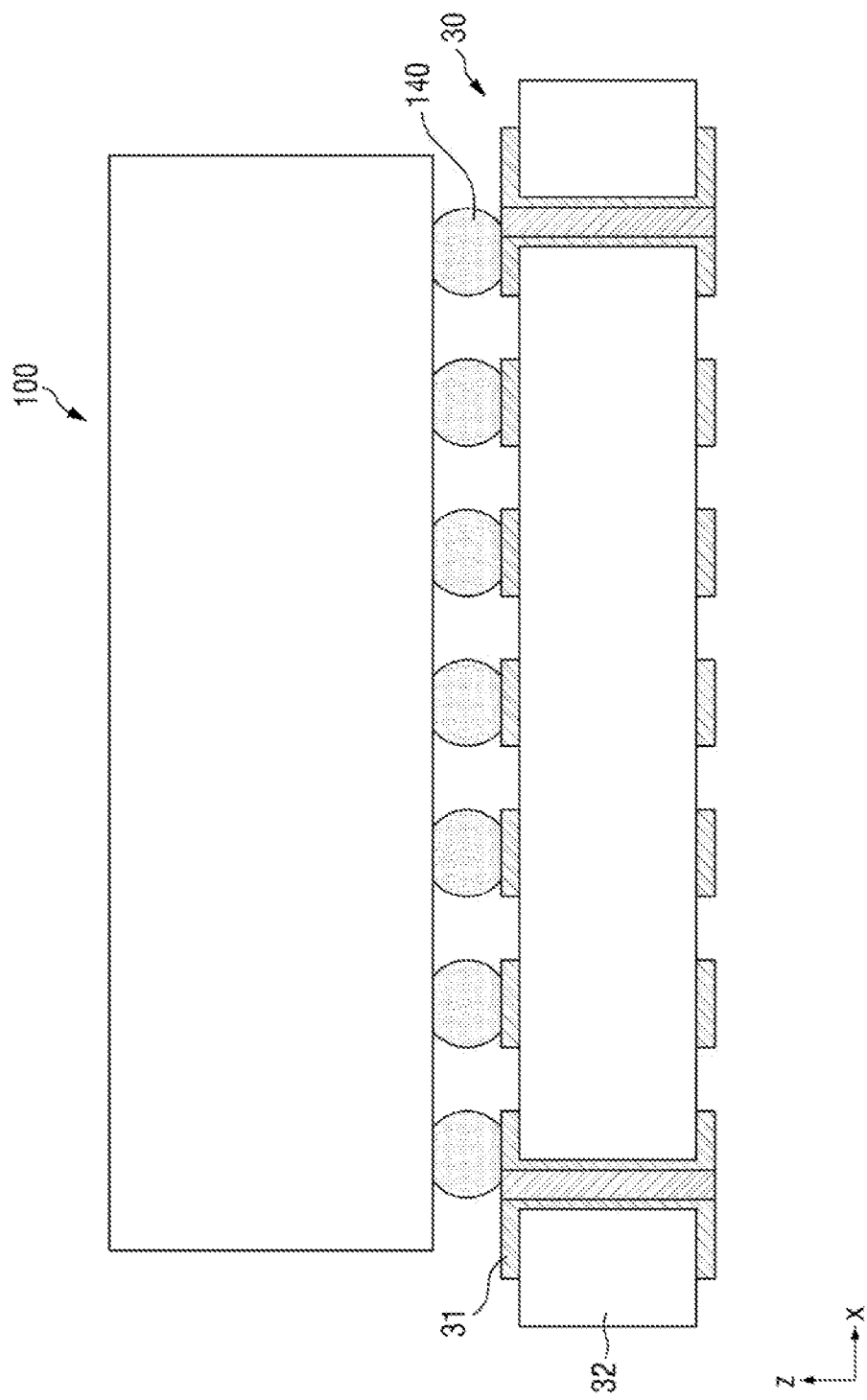
FIG. 3 illustrates a semiconductor package and a main board of FIG. 2.
Figure 4:
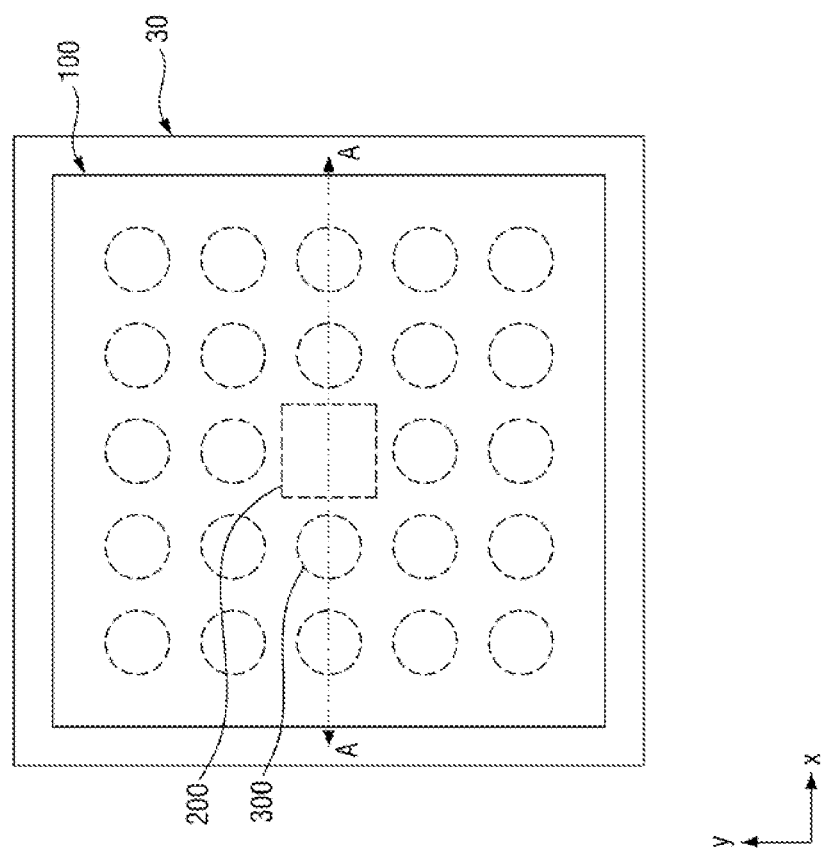
FIG. 4 illustrates the semiconductor package of FIG. 3 is viewed from above.

FIGS. 1 and 2 are diagrams for explaining an electronic device according to some embodiments of the present disclosure. FIG. 3 is a diagram for explaining a semiconductor package and a main board of FIG. 2. FIG. 4 is diagram as the semiconductor package of FIG. 3 is viewed from above.

Figure 5:
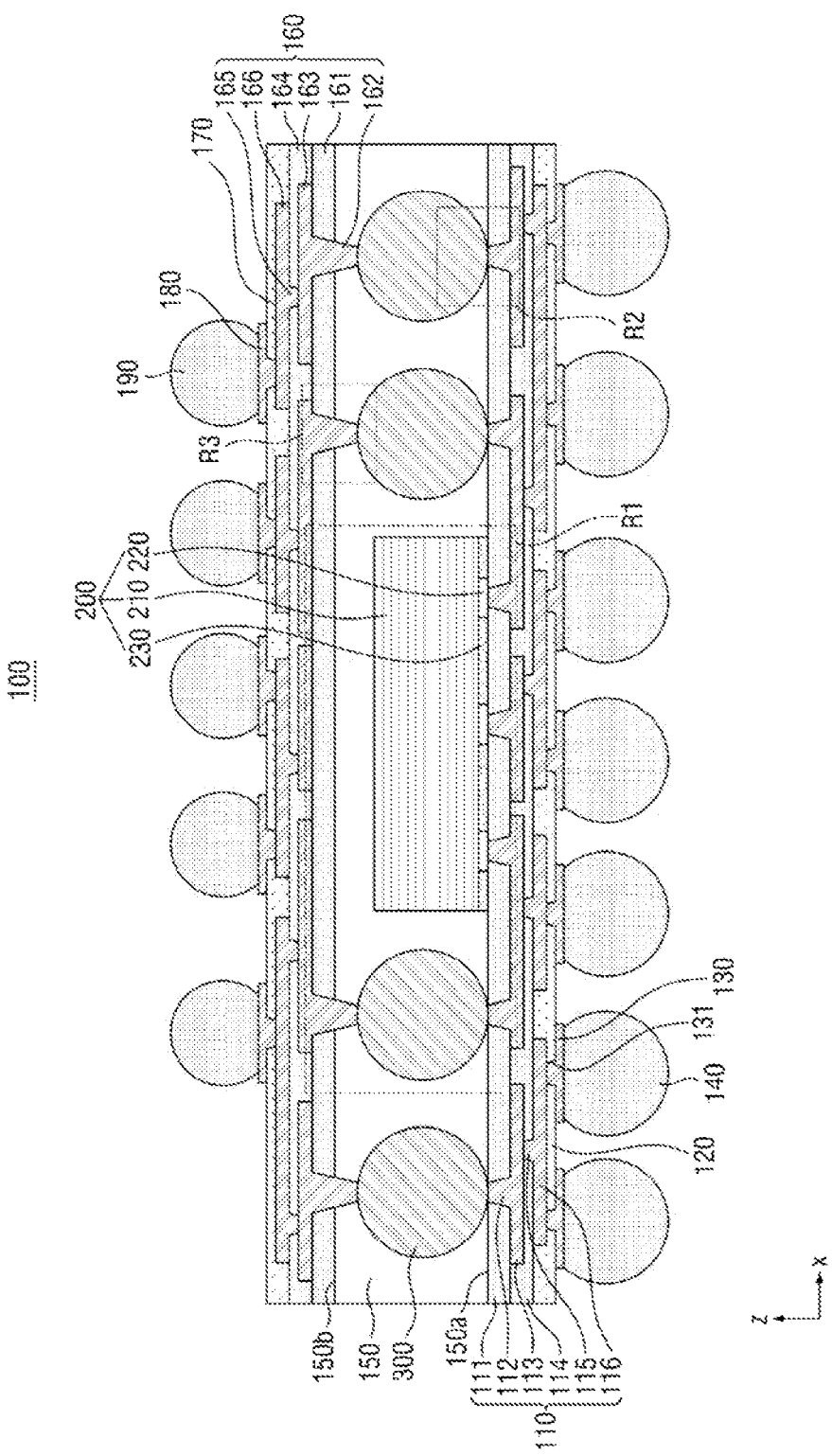
FIG. 5 is a cross-sectional view of the semiconductor package taken along A-A of FIG. 4.

FIG. 5 is a cross-sectional view for explaining the semiconductor package taken along A-A of FIG. 4.

Referring to FIG. 1, an electronic device 1 may include a host 10, an interface 11 and a semiconductor package 100.

In an implementation, the host 10 may be connected to the semiconductor package 100 through an interface 11. In an implementation, the host 10 may transmit the signal to the semiconductor package 100 to control the semiconductor package 100. In an implementation, the host 10 may receive the signal from the semiconductor package 100 to process the data included in the signal.

In an implementation, the host 10 may include a central processing unit (CPU), a controller, an application specific integrated circuit (ASIC) and the like. In an implementation, the host 10 may include a memory chip such as a DRAM (Dynamic Random Access Memory), a SRAM (Static RAM), a PRAM (Phase-change RAM), a MRAM (Magneto resistive RAM), a FeRAM (Ferroelectric RAM) and a RRAM (Resistive RAM).

Referring to FIGS. 1 and 2, the electronic device 1 may include a host 10, a body 20, a main board 30, a camera module 40 and a semiconductor package 100.

The main board 30 may be mounted inside the body 20 of the electronic device 1. The host 10, the camera module 40 and the semiconductor package 100 may be mounted on the main board 30. The host 10, the camera module 40 and the semiconductor package 100 may be electrically connected by the main board 30. In an implementation, the interface 11 may be implemented by the main board 30.

The host 10 and the semiconductor package 100 may be electrically connected by the main board 30 to send and receive signals.

Referring to FIG. 3, the semiconductor package 100 may be placed on the main board 30. In an implementation, a connection terminal 140 of the semiconductor package 100 may be placed on the main board 30. In an implementation, the main board 30 may be connected by the connection terminal 140 of the semiconductor package 100.

In an implementation, the main board 30 may be a printed circuit board (PCB), a ceramic substrate, a glass substrate, an interposer substrate, or the like. Herein, the main board 30 will be explained on the premise that it is a printed circuit board.

The main board 30 may include a wiring structure 31 and a core 32. The core 32 may include a CCL (Copper Clad Laminate), a PPG, an ABF (Ajimoto Build-up Film), epoxy, polyimide, or the like. The wiring structure 31 may include, e.g., copper (Cu), aluminum (Al), silver (Ag), tin (Sn), gold (Au), nickel (Ni), lead (Pb), titanium (Ti), or alloys thereof. As used herein, the term "or" is not an exclusive term, e.g., "A or B" would include A, B, or A and B.

The core 32 may be placed in a central part of the main board 30, and the wiring structure 31 may be placed in an upper part and a lower part of the core 32. The wiring structure 31 may be exposed in the upper part and the lower part of the main board 30.

In an implementation, the wiring structure 31 may penetrate the core 32. The wiring structure 31 may electrically connect the elements that come into contact with the main board 30. In an implementation, the wiring structure 31 may electrically connect the semiconductor package 100 and the host 10. In an implementation, the wiring structure 31 may electrically connect the semiconductor package 100 and the host 10 through the connection terminal 140.

Referring to FIGS. 4 and 5, the semiconductor package 100 may include a first redistribution layer 110, a first semiconductor chip 200, an interconnector 300, a passivation layer 120, an underbump metal layer 130, a connection terminal 140, an encapsulator 150, a second redistribution layer 160, a passivation layer 170, an underbump metal layer 180, and a connection terminal 190. As used herein, the terms "first," "second," and the like are merely for differentiation, and are not intended to imply or require sequential inclusion of the described elements.

The first semiconductor chip 200 may be on the first redistribution layer 110. In an implementation, the first semiconductor chip 200 may be on the central part of the first redistribution layer 110. The first semiconductor chip 200 may be electrically connected to the first redistribution layer 110.

The first semiconductor chip 200 may include a logic circuit. In an implementation, the first semiconductor chip 200 may include an integrated circuit (IC). In an implementation, the first semiconductor chip 200 may include, e.g., an application processor chip such as a central processor (e.g., a CPU), a graphic processor (e.g., a GPU), a digital signal processor, an encryption processor, a microprocessor, or a microcontroller.

The first semiconductor chip 200 may include a body 210, a connection pad 220 and a passivation film 230. The body 210 may include silicon (Si), germanium (Ge), gallium arsenide (GaAs), or the like, and the body 210 may include various circuits. The connection pad 220 may connect the semiconductor chip 200 to another configuration (e.g., the first redistribution layer 110). The connection pad 220 may include a conductive material. The passivation film 230 may expose the connection pad 220 on the body 210. The passivation film 230 may be an oxide film, a nitride film, or a bilayer of an oxide film and a nitride film.

The interconnector 300 may be on the first redistribution layer 110. The interconnector 300 may be spaced apart from the first semiconductor chip 200. In an implementation, the plurality of interconnectors 300 may be on the first redistribution layer 110 to surround (e.g., around) the first semiconductor chip 200. In an implementation, as illustrated in FIG. 4, a plurality of interconnectors 300 may be on the first redistribution layer 110 at regular intervals.

The interconnector 300 may include a metal ball including a metal material. In an implementation, the interconnector 300 may include a conductive material such as copper (Cu), aluminum (Al), silver (Ag), tin (Sn), gold (Au), nickel (Ni), lead (Pb), titanium (Ti), or alloys thereof.

The metal ball may have a spherical shape including a metal material. In an implementation, the interconnector 300 may have a constant distance from the center of the interconnector 300 to the outer face of the interconnector 300. The distance from the center of the interconnector 300 to the outer face of the interconnector 300 may be a radius. The distance from the outer face of the interconnector 300 to the other outer face of the interconnector 300 passing through the center of the interconnector 300 may be a diameter. In an implementation, the diameter of the interconnector 300 may be constant or uniform.

In an implementation, the interconnector 300 may include a rectangular parallelepiped metal material rather than a spherical metal ball. In an implementation, the interconnector 300 may not be a spherical metal ball.

The interconnector 300 may be in contact with the first redistribution layer 110. In an implementation, the interconnector 300 may be electrically connected to the first redistribution layer 110. In an implementation, the interconnector 300 and the first semiconductor chip 200 may be electrically connected through the first redistribution layer 110.

The interconnector 300 may be on the same plane as the first semiconductor chip 200. In an implementation, surfaces or points on which the interconnector 300 and the first semiconductor chip 200 are in contact with the first redistribution layer 110 may be the same plane.

The encapsulator 150 may cover the first redistribution layer 110. The encapsulator 150 may cover the interconnector 300 on the first redistribution layer 110. The encapsulator 150 may cover at least a part of the first semiconductor chip 200 on the first redistribution layer 110. In an implementation, the encapsulator 150 may cover the side walls of the first semiconductor chip 200. In an implementation, the encapsulator 150 may cover an upper face or surface (e.g., surface facing away from the first redistribution layer 110 in a vertical Z direction) of the first semiconductor chip 200. The encapsulator 150 may be referred to as a molded layer.

The encapsulator 150 may help protect the first semiconductor chip 200 and the interconnector 300. The encapsulator 150 may fill the outside of the interconnector 300 and a space between the interconnector 300 and the first semiconductor chip 200. The encapsulator 150 may fill the space between the interconnector 300 and the first semiconductor chip 200, and a buckling may be reduced while acting as an adhesive.

The encapsulator 150 may include an insulating material. In an implementation, the encapsulator 150 may include a thermosetting resin such as an epoxy resin, a thermoplastic resin such as polyimide, or a resin in which a reinforcing material such as an inorganic filler is included therein, e.g., ABF, FR-4, BT, PID resin, or the like. In an implementation, the encapsulator 150 may also include a molding material such as an EMC.

The encapsulator 150 may include conductive particles for blocking electromagnetic waves. In an implementation, the encapsulator 150 may include copper (Cu), aluminum (Al), silver (Ag), tin (Sn), gold (Au), nickel (Ni), lead (Pd), titanium (Ti), solder, or the like.

The encapsulator 150 may include a first face (e.g., surface) 150a and a second face 150b. The first face 150a of the encapsulator 150 may be a face facing the first redistribution layer 110, and the second face 150b of the encapsulator 150 may be a face facing the second redistribution layer 160. The first face 150a may be in contact with the first redistribution layer 110, and the second face 150b may be in contact with the second redistribution layer 160. The first redistribution layer 110 may be on the first face 150a, and the second redistribution layer 160 may be on the second face 150b.

The first redistribution layer 110 may redistribute the connection pad 220 of the first semiconductor chip 200. The first redistribution layer 110 may be a FRDL (front redistribution layer). A plurality of connection pads 220 of the first semiconductor chip 200 may be redistributed through the first redistribution layer 110. In an implementation, the plurality of connection pads 220 may be physically or electrically connected to the connection terminal 140, the interconnector 300 and the connection terminal 190 through the first redistribution layer 110.

The first redistribution layer 110 may be in contact with some parts of the first semiconductor chip 200, the interconnector 300 and the encapsulator 150. In an implementation, a first face of the first redistribution layer 110 facing the first semiconductor chip 200, the interconnector 300 and the encapsulator 150 may be in contact with some parts of the first semiconductor chip 200, the interconnector 300 and the encapsulator 150.

The first redistribution layer 110 may include, e.g., an insulating layer 111, a via 112, a line wiring 113, an insulating layer 114, a via 115 a line wiring 116 and the like.

The insulating layer 111 may be on the first face 150a of the encapsulator 150. The via 112 may penetrate the insulating layer 111 and be connected to the line wiring 113. The line wiring 113 may be connected to the via 112 and may be formed below the insulating layer 111. The via 112 may connect the interconnector 300 and the line wiring 113. The via 112 may connect a connection pad 220 of the first semiconductor chip 200 and the line wiring 113.

The insulating layer 114 may cover the insulating layer 111 and the line wiring 113. The via 115 may penetrate the insulating layer 114 and be connected to the line wiring 116. The line wiring 116 may be connected to the via 115 and may be formed below the insulating layer 114. The via 115 may connect the line wiring 113 and the line wiring 116.

The insulating layers 111 and 114 may include an insulating material. In an implementation, the insulating layers 111 and 114 may include a photosensitive insulating material such as a PID resin, in addition to a thermosetting resin such as an epoxy resin, and a thermoplastic resin such as polyimide. When the photosensitive insulating material is used as the insulating layers 111 and 114, the insulating layers 111 and 114 may be formed to be thinner.

The vias 112 and 115 may electrically connect line wirings 113 and 116, an interconnector 300 and a connection pad 220 formed on other layers. As a result, an electrical route may be formed in the semiconductor package 100.

The vias 112 and 115 may include conductive materials such as copper (Cu), aluminum (Al), silver (Ag), tin (Sn), gold (Au), nickel (Ni), lead (Pb), titanium (Ti) or alloys thereof. The vias 112 and 115 may be formed by being fully charged with a conductive material. In an implementation, in the vias 112 and 115, the conductive material may be formed along the walls of the vias. The shapes of the vias 112 and 115 may include suitable shapes, e.g., a tapered shape or a cylindrical shape.

The line wirings 113 and 116 may redistribute the connection pad 220. The line wirings 113 and 116 may include conductive materials such as copper (Cu), aluminum (Al), silver (Ag), tin (Sn), gold (Au), nickel (Ni), lead (Pb), titanium (Ti) or alloys thereof. The line wirings 113 and 116 may perform various functions depending on the design of the layer. In an implementation, the line wirings 113 and 116 may include a ground (GND) pattern, a power (PWR) pattern, a signal (S) pattern, and the like.

The passivation layer 120 may help protect the first redistribution layer 110 from the outside. The passivation layer 120 may include an opening 131 that exposes a part of the line wiring 116 of the first redistribution layer 110. The opening 131 may expose a part of one side of the line wiring 116.

The passivation layer 120 may include an insulating material. In an implementation, the passivation layer 120 may include a photosensitive insulating material such as a photosensitive insulating resin. In an implementation, the passivation layer 120 may include a solder resist.

The underbump metal layer 130 may help improve the connection reliability of the connection terminal 140 to improve board level reliability. The underbump metal layer 130 may be formed along wall faces in the opening 131 of the passivation layer 120 and along the exposed part of the line wiring 116. The underbump metal layer 130 may be formed by a metallization process using a metal.

The connection terminal 140 may physically and electrically connect the semiconductor package 100 to the outside.

In an implementation, the semiconductor package 100 may be mounted on the main board 30 of the electronic device 1 through the connection terminal 140.

The connection terminal 140 may include a conductive material. In an implementation, the connection terminal 140 may include solder or the like. The connection terminal 140 may include a land, a ball, a pin, or the like. The number of connection terminals 140 may vary depending on the number of connection pads 220 of the first semiconductor chip 200.

At least one of the plurality of connection terminals 140 may be in a fan-out region. The fan-out region refers to a region beyond the region in which the first semiconductor chip 200 is placed. The semiconductor package 100 may be a fan-out semiconductor package accordingly. The fan-out semiconductor package may be more reliable than a fan-in semiconductor package, may be able to implement a large number of I/O terminals, and may facilitate a 3D interconnection. In an implementation the fan-out semiconductor package may be mounted on electronic devices without a separate substrate as compared to a BGA (Ball Grid Array) package, a LGA (Land Grid Array) package, or the like, and may be fabricated to be thinner and has an advantage of excellent competitive price.

The semiconductor package 100 may be a fan-out panel level package. In an implementation, the semiconductor package 100 may redistribute the connection pad 220 of the semiconductor chip 200 through the first redistribution layer 110 formed on one side of the encapsulator 150 that surrounds the first semiconductor chip 200 and the interconnector 300. In an implementation, the semiconductor package 100 may be a fan-out wafer level package.

The second redistribution layer 160 may be on the encapsulator 150. In an implementation, the second redistribution layer 160 may be on the second face 150b. The second redistribution layer 160 may cover the first semiconductor chip 200 and the interconnector 300.

The second redistribution layer 160 may redistribute the connection pad 220 of the first semiconductor chip 200. The second redistribution layer 160 may be a BRDL (back redistribution layer). The plurality of connection pads 220 of the first semiconductor chip 200 may be redistributed through the first redistribution layer 110 and the second redistribution layer 160. In an implementation, a plurality of connection pads 220 may be physically or electrically connected to the connection terminal 140, the interconnector 300 and the connection terminal 190 through the first redistribution layer 110 and the second redistribution layer 160.

The second redistribution layer 160 may be in contact with some parts of the interconnector 300 and the encapsulator 150. In an implementation, the via 162 of the second redistribution layer 160 may be in contact with the interconnector 300 and the encapsulator 150, and the insulating layer 161 of the second redistribution layer 160 may be in contact with the encapsulator 150.

The second redistribution layer 160 may include an insulating layer 161, a via 162, a line wiring 163, an insulating layer 164, a via 165 and a line wiring 166.

The insulating layer 161 may be on the second face 150b of the encapsulator 150. The via 162 may penetrate the insulating layer 161 and be connected to the interconnector 300. A part of the via 162 may be inside the encapsulator 150. In an implementation, a part of the via 162 that is surrounded by the encapsulator 150 may be in contact with and connected to the interconnector 300. The line wiring 163 may be connected to the via 162 and may be formed on the insulating layer 161. The via 162 may connect the interconnector 300 and the line wiring 163.

The insulating layer 164 may cover the insulating layer 161 and the line wiring 163. The via 165 may penetrate the insulating layer 164 and be connected to the line wiring 166. The line wiring 166 may be connected to the via 165 and may be above the insulating layer 164. The via 165 may connect the line wiring 163 and the line wiring 166.

The insulating layer 161, the via 162, the line wiring 163, the insulating layer 164, the via 165 and the line wiring 166 of the second redistribution layer 160 may have the same configuration as the insulating layer 111, the via 112, the line wiring 113, the insulating layer 114, the via 115 and the line wiring 116 of the first redistribution layer 110 explained above.

In an implementation, the insulating layers 161 and 164 may be the same as the insulating layers 111 and 114, the vias 162 and 165 may be the same as the same as the vias 112 and 115, and the line wirings 163 and 166 may be the same as the line wirings 113 and 116. In an implementation, the second redistribution layer 160 may have a configuration different from that of the first redistribution layer 110, and may be formed by another process.

The passivation layer 170 may help protect the second redistribution layer 160 from the outside. The passivation layer 170 may expose a part of one side of the line wiring 166.

The underbump metal layer 180 may help improve the connection reliability of the connection terminal 190 and improve the board level reliability. The underbump metal layer 180 may be formed along the wall faces of the passivation layer 170 and one side of the exposed line wiring 166.

The connection terminal 190 may physically and electrically connect the semiconductor package 100 to other semiconductor packages.

The passivation layer 170, the underbump metal layer 180 and the connection terminal 190 may have the same configuration as the passivation layer 120, the underbump metal layer 130 and the connection terminal 140 explained above. In an implementation, the passivation layer 170, the underbump metal layer 180 and the connection terminal 190 may include configurations different from those of the passivation layer 120, the underbump metal layer 130 and the connection terminals 140, and may also be formed by another process.

The first semiconductor chip 200 may be electrically connected to the host 10 through the first redistribution layer 110, the underbump metal layer 130, and the connection terminal 140. The first semiconductor chip 200 may be electrically connected to another semiconductor package (e.g., a semiconductor package 400 of FIG. 14 to be explained below) through the first redistribution layer 110, the interconnector 300, the second redistribution layer 160, the underbump metal layer 180, and the connection terminal 190. In an implementation, the connection pad 220 of the first semiconductor chip 200 may be redistributed through the first redistribution layer 110, the interconnector 300, the second redistribution layer 160, and the like.

Figure 6:
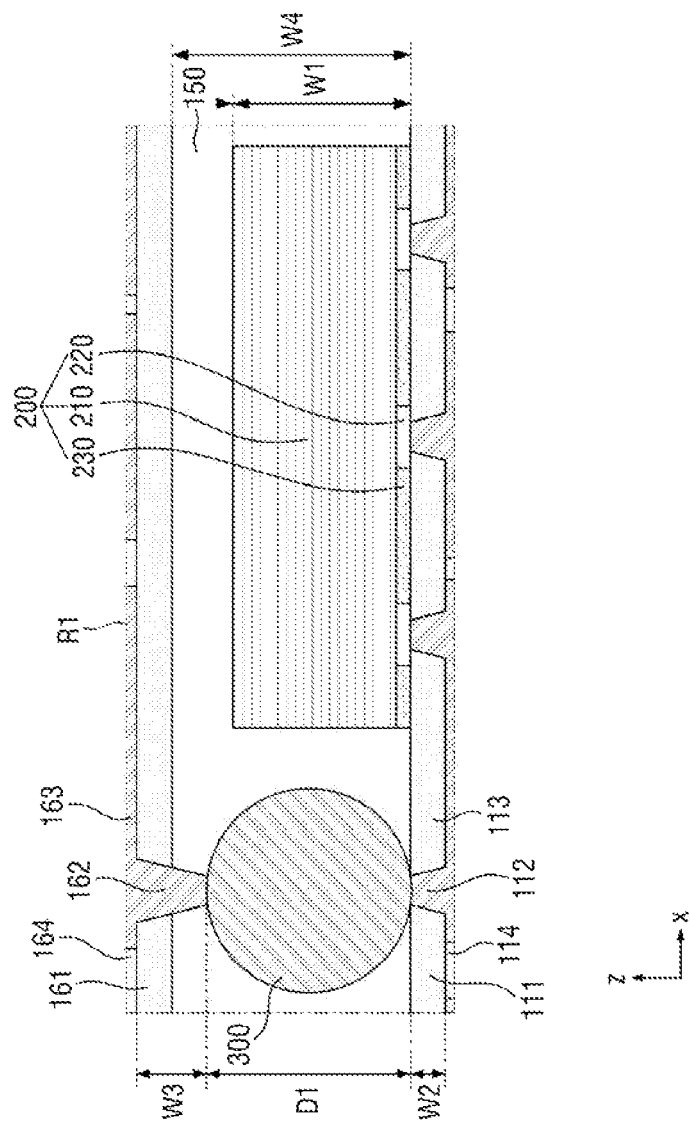
FIG. 6 is an enlarged view of a region R1 of FIG. 5.

FIG. 6 is an enlarged view of a region R1 of FIG. 5.

Referring to FIG. 6, a diameter of the interconnector 300 may be a first diameter D1. A length from one side of the interconnector 300 passing through the center of the interconnector 300 to the other side opposite to one side of the interconnector 300 may be the first diameter D1. The first diameter D1 may be twice the radius of the interconnector 300. The first diameter D1 may be a height of the interconnector 300 (e.g., a height in the vertical third direction Z).

Hereinafter, it is assumed that the interconnector 300 has the first diameter D1 which is a constant diameter.

A thickness of the first semiconductor chip 200 (e.g., in the third direction Z) may be a first thickness W1. In an implementation, a sum of thicknesses of the body 210 and the connection pad 220 may be the first thickness W1, or the thickness of only the body 210 may be the first thickness W1.

A thickness of the via 112 (e.g., in the third direction Z) may be a second thickness W2. In an implementation, the thickness of the portion in which the via 112 penetrates the insulating layer 111 may be the second thickness W2. The second thickness W2 may be a thickness from the upper face (at which the via 112 is in contact with the interconnector 300) to the lower face (at which the via 112 is in contact with the line wiring 113).

A thickness of the via 162 (e.g., in the third direction Z) may be a third thickness W3. In an implementation, the sum of the thickness of the portion in which the via 162 penetrates the insulating layer 161 and the thickness of the portion surrounded by the encapsulator 150 may be the third thickness W3. The third thickness W3 may be a thickness from the lower face at which the via 162 is in contact with the interconnector 300 to the upper face at which the via 162 is in contact with the line wiring 163. The third thickness W3 may be greater than the second thickness W2. In an implementation, the via 162 may be or extend deeper than the via 112 and connected to the interconnector 300.

The interconnector 300 may be between the via 112 and the via 162. In an implementation, the interconnector 300 may be on the upper face of the via 112 and may be on the lower face of the via 162. The interconnector 300 may be physically and electrically connected to the via 112 and via 162. In an implementation, the interconnector 300 may be physically in contact with the via 112, the via 162 and the encapsulator 150.

A thickness of the encapsulator 150 (e.g., in the third direction Z) may be a fourth thickness W4. In an implementation, a distance from the first face 150a to the second face 150b of the encapsulator 150 (in the third direction Z) may be the fourth thickness W4.

The first diameter D1 of the interconnector 300 may be smaller than the fourth thickness W4 of the encapsulator 150. In an implementation, the encapsulator 150 may completely cover the interconnector 300 and protect the interconnector 300. In an implementation, there may be an encapsulator 150 on the upper face of the interconnector 300.

The first thickness W1 of the first semiconductor chip 200 may be smaller than or equal to the fourth thickness W4 of the encapsulator 150.

When the first thickness W1 of the first semiconductor chip 200 is smaller than the fourth thickness W4 of the encapsulator 150, the encapsulator 150 may completely cover the first semiconductor chip 200. In an implementation, the encapsulator 150 may cover both side walls and the upper face of the first semiconductor chip 200.

When the first thickness W1 of the first semiconductor chip 200 is the same as the fourth thickness W4 of the encapsulator 150, the encapsulator 150 may cover only the side walls of the first semiconductor chip 200. In an implementation, the encapsulator 150 may not cover the upper face of the first semiconductor chip 200. As a result, the upper face of the first semiconductor chip 200 may be in contact with the second redistribution layer 160.

The sum of the third thickness W3 of the via 162 and the first diameter D1 of the interconnector 300 may be greater than the fourth thickness W4 of the encapsulator 150. In an implementation, the via 162 may penetrate the insulating layer 161, and a part of the via 162 may be inside the insulating layer 161. In an implementation, the via 162 may penetrate the encapsulator 150 and may be connected to the interconnector 300, and a part of the via 162 may be inside the encapsulator 150.

In an implementation, the third thickness W3 of the portion in which the via 162 extends from the line wiring 163 to the interconnector 300 may be greater than the thickness of the portion of the encapsulator 150 on the interconnector 300. In an implementation, the third thickness W3 of the portion in which the via 162 extends from the line wiring 163 to the interconnector 300 may be greater than the thickness of the insulating layer 161.

Figure 7:
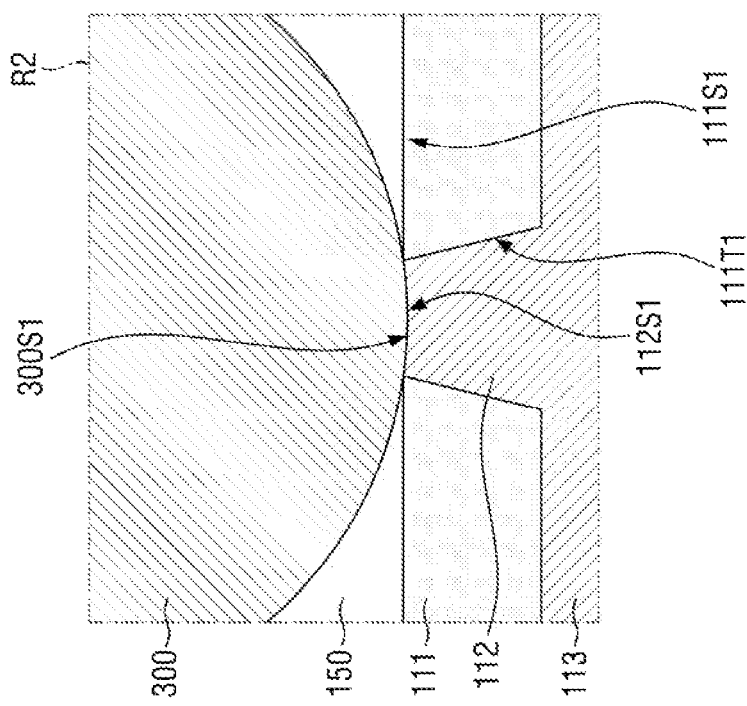
FIG. 7 is an enlarged view of a region R2 of FIG. 5.

FIG. 7 is an enlarged view of a region R2 of FIG. 5.

Referring to FIG. 7, the via 112 and the interconnector 300 may be in contact with each other. In an implementation, the via 112 and interconnector 300 may be physically and electrically connected to each other.

In an implementation, the via 112 may be formed along an interconnector first face 300S1 and an insulating layer first trench 111T1. In an implementation, the via 112 may be formed along the side walls of the insulating layer first trench 111T1 of the insulating layer 111 and a lower face of the insulating layer first trench 111T1 formed by exposure.

A via first face 112S1 of the via 112 may be substantially the same as (e.g., complementary to) the interconnector first face 300S1 of the interconnector 300. In an implementation, the via 112 may be on the interconnector first face 300S1, and a face at which the via 112 and the interconnector 300 are in contact with each other (e.g., an interface) may be commonly the via first face 112S1 and the interconnector first face 300S1.

An insulating layer first face 111S1 may not be in contact with the interconnector 300. In an implementation, the insulating layer first face 111S1 may not be in contact with the interconnector first face 300S1 and may be covered with the encapsulator 150.

The via first face 112S1 of the via 112 and the interconnector first face 300S1 of the interconnector 300 may be curved faces. In an implementation, the interconnector 300 may be a metal ball, and the interconnector first face 300S1 is a curved face. In an implementation, the via 112 may be on the interconnector first face 300S1, and the via first face 112S1 may also be a (e.g., complementary) curved face. In an implementation, the interconnector first face 300S1 may be a slightly convex curved surface and the via first face 112S1 may be a slightly concave curved surface that is complementary to the interconnector first face 300S1.

Figure 8:
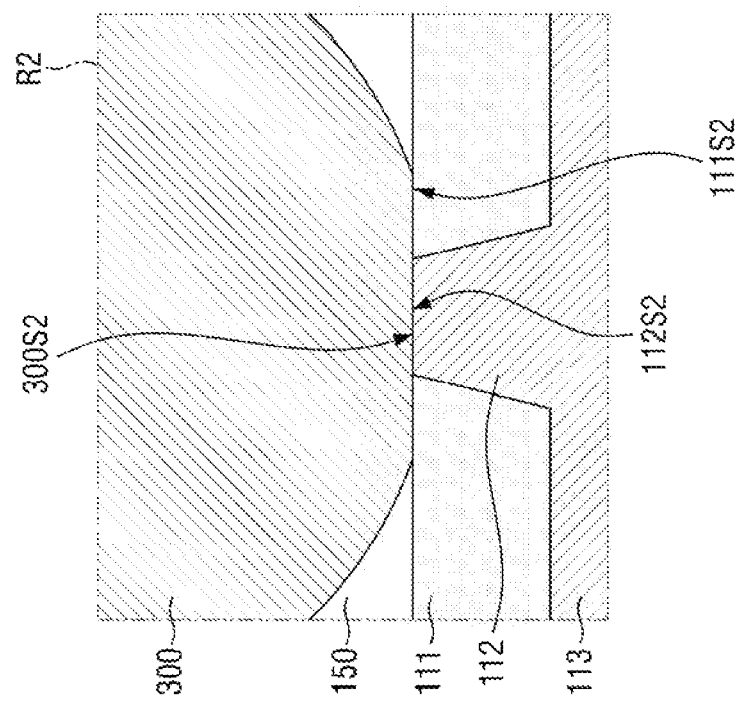
FIG. 8 is an enlarged view of a region R2 of FIG. 5.

FIG. 8 is an enlarged view of a region R2 of FIG. 5.

Referring to FIG. 8, a contacted face (e.g., interface) between the interconnector 300 and the first redistribution layer 110 may differ from the region R2 illustrated in FIG. 7.

The interconnector 300 may be attached onto an adhesive film (e.g., an adhesive film 510 of FIG. 16) attached before the first redistribution layer 110 is formed. The interconnector 300 may be attached onto the adhesive film by being dropped. In this case, when the interconnector 300 is dropped by applying a pressure thereto, the lower face of the interconnector 300 may have a flat shape. In an implementation, the contact portion between the interconnector 300 and the adhesive film may have a flat shape rather than a spherical shape.

After that, the adhesive film may be removed and the first redistribution layer 110 may be formed on the interconnector 300. In an implementation, a lower face of the interconnector 300 (e.g., an interconnector second face 300S2) may be flattened by application of pressure, and may not be subjected to grinding.

The via second face 112S2 of the via 112 and the insulating layer second face 111S2 of the insulating layer 111 may be in contact with the interconnector second face 300S2 of the interconnector 300. In an implementation, the via second face 112S2 may be in contact with and connected to the interconnector second face 300S2.

The via second face 112S2 and the interconnector second face 300S2 (at which the via 112 and the interconnector 300 are in contact with each other) may be substantially a plane (e.g., substantially planar or substantially flat). The insulating layer second face 111S2 and the interconnector second face 300S2 (at which the insulating layer 111 and the interconnector 300 are in contact with each other) may be substantially a plane. In an implementation, the plane does not mean a perfect plane, and there may be an error due to a process.

In an implementation, the via second face 112S2 of the via 112, the insulating layer second face 111S2 of the insulating layer 111, and the interconnector second face 300S2 of the interconnector 300 may be on the same plane.

In an implementation, the interconnector second face 300S2 may be wider than the interconnector first face 300S1 of FIG. 7, and the via 112 may be on the wider interconnector second face 300S2. The interconnector 300 and the via 112 may be more easily connected accordingly, even if there is a process error.

Figure 9:
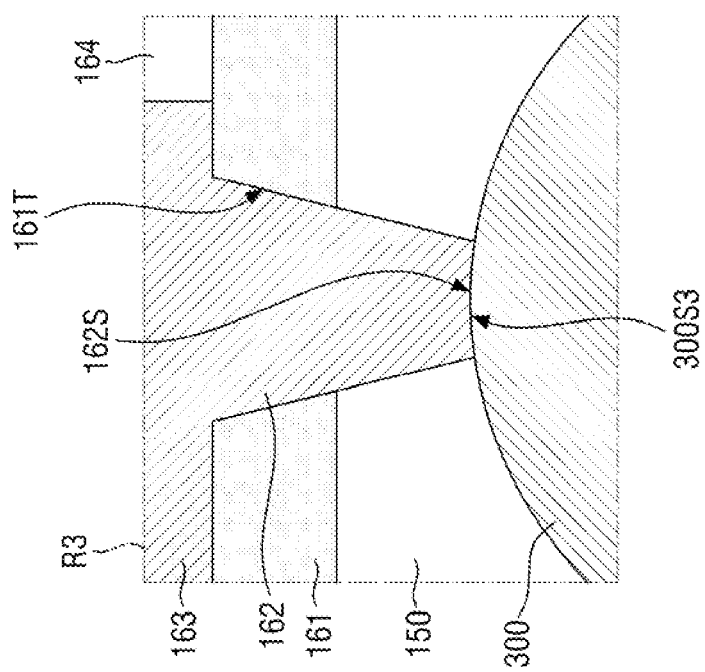
FIG. 9 is an enlarged view of a region R3 of FIG. 5.

FIG. 9 is an enlarged view of a region R3 of FIG. 5.

Referring to FIG. 9, the via 162 and the interconnector 300 may be in contact with each other. In an implementation, the via 162 and the interconnector 300 may be physically and electrically connected to each other.

In an implementation, the via 162 may be formed along an interconnector third face 300S3 and a trench 161T. In an implementation, the via 162 may be formed along the side walls of the trench 161T in the insulating layer 161 and the encapsulator 150, and the lower face of the trench 161T formed by exposure.

A via face 162S of the via 162 may be substantially the same as (e.g., complementary to) the interconnector third face 300S3 of the interconnector 300. In an implementation, the via 162 may be on the interconnector third face 300S3, and the face at which the via 162 and the interconnector 300 are in contact with each other (e.g., interface) may be commonly the via face 162S and the interconnector third face 300S3.

The via face 162S of the via 162 and the interconnector third face 300S3 of the interconnector 300 may be curved faces. In an implementation, the interconnector 300 may be a metal ball, and the interconnector third face 300S3 may be a curved face. In an implementation, the via 162 may be on the interconnector third face 300S3, and the via face 162S may also be a curved face. In an implementation, the interconnector third face 300S3 may be a convex curved face, and the via face 162S may be a concave curved face complementary to the interconnector third face 300S3.

The interconnector 300 may include a metal ball, which may be finished in advance. In an implementation, the first redistribution layer 110 and the second redistribution layer 160 may be connected to each other with no design time and design cost, by simply placing the metal balls without newly designing the interconnector 300 which connects the first redistribution layer 110 and the second redistribution layer 160.

In an implementation, by forming the via 112 and the via 162 on both sides of the interconnector 300 without processing the interconnector 300, the time for forming the semiconductor package 100 may be shortened. In an implementation, the fabricating process of the semiconductor package 100 may be improved.

Hereinafter, a semiconductor package 100a including a coating layer 310 will be explained referring to FIG. 10.

Figure 10:
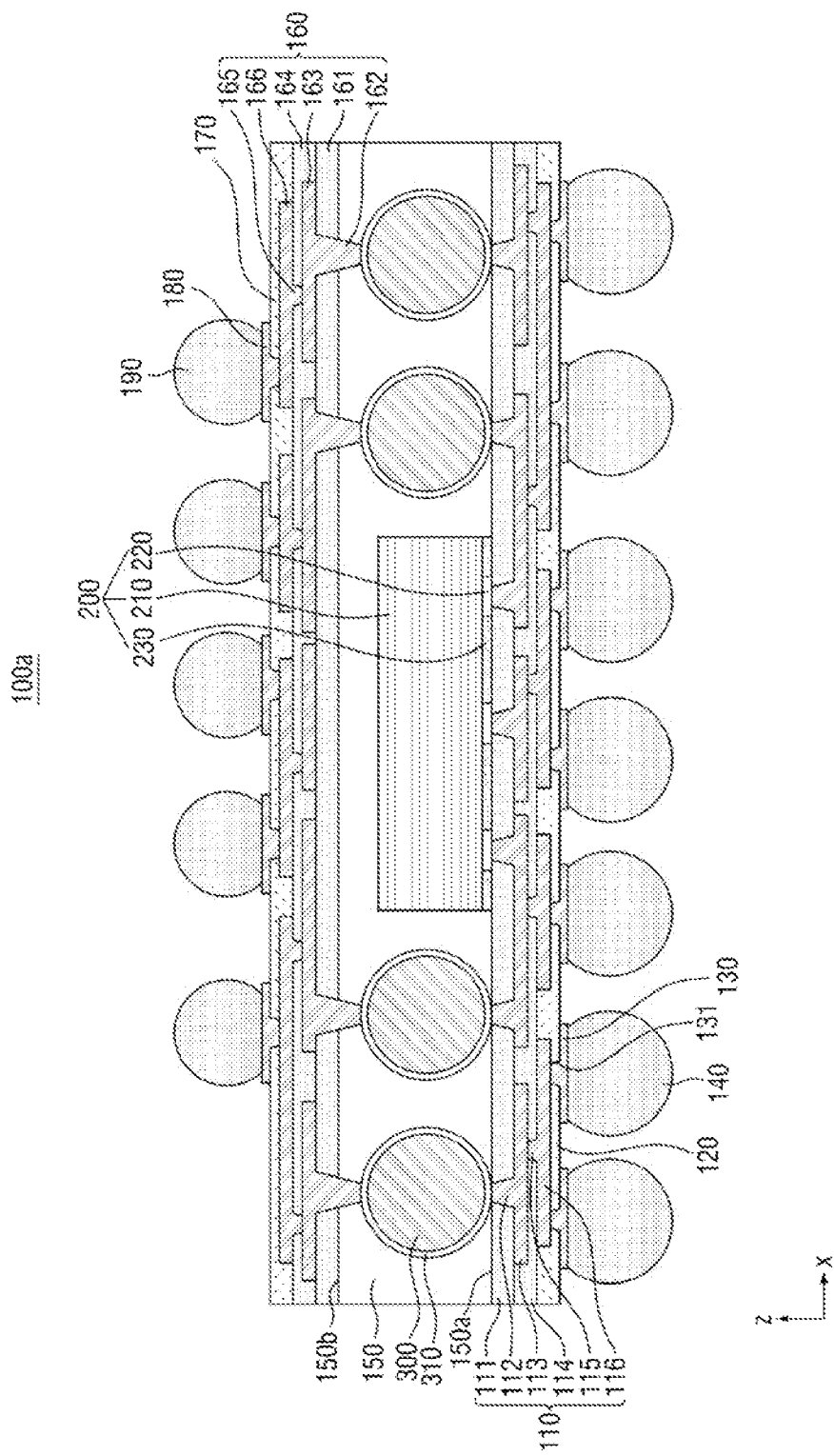
FIG. 10 is a cross-sectional view of a semiconductor package according to some embodiments of the present disclosure.

FIG. 10 is a cross-sectional view of a semiconductor package according to some embodiments of the present disclosure. For convenience of explanation, repeated parts of contents explained using FIGS. 1 to 9 may be briefly explained or omitted.

Referring to FIG. 10, the interconnector 300 may be coated with a coating layer 310 (e.g., the interconnector 300 may further include the coating layer 310 thereon). In an implementation, the coating layer 310 may surround the surface of the interconnector 300. When viewed from the outside, the interconnector 300 may not be visible by or due to the presence of the coating layer 310.

The coating layer 310 may include a material different from the interconnector 300. In an implementation, the interconnector 300 may include one of copper (Cu), aluminum (Al), silver (Ag), tin (Sn), gold (Au), nickel (Ni), lead (Pb), or titanium (Ti), the coating layer 310 may include another of copper (Cu), aluminum (Al), silver (Ag), tin (Sn), gold (Au), nickel (Ni), lead (Pb), or titanium (Ti). In an implementation, the coating layer 310 may also include solder.

The coating layer 310 may be physically and electrically connected to the via 112 and the via 162. In an implementation, the lower face of the coating layer 310 may be connected to the via 112, and the upper face of the coating layer 310 may be connected to the via 162.

The coating layer 310 and the interconnector 300 may be electrically connected to the via 112 and the via 162 to transmit and receive signals.

Hereinafter, a semiconductor package 100b including an electromagnetic wave shielding film 240 will be explained referring to FIG. 11.

Figure 11:
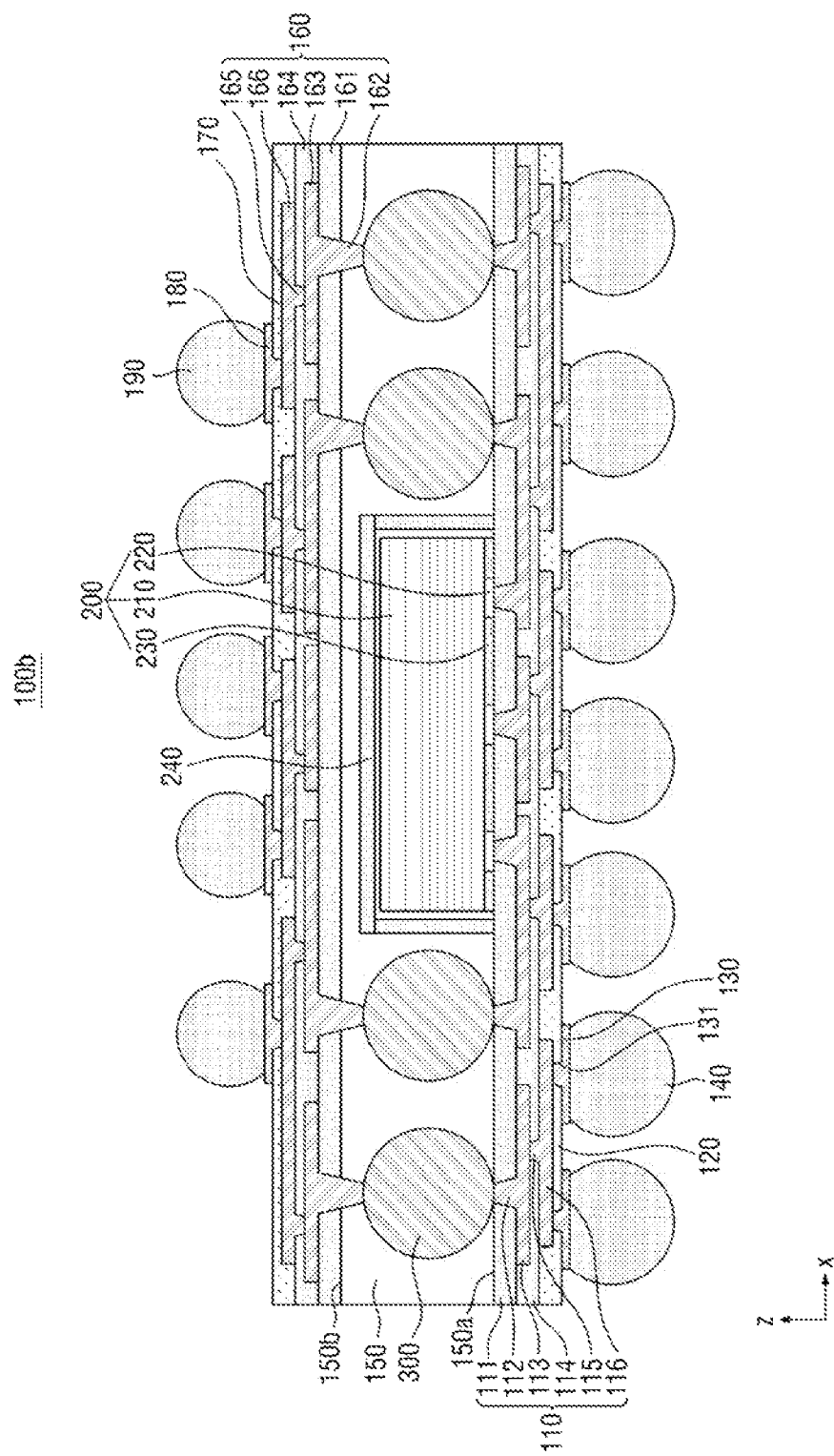
FIG. 11 is a cross-sectional view of a semiconductor package according to some embodiments of the present disclosure.

FIG. 11 is a cross-sectional view of a semiconductor package according to some embodiments of the present disclosure. For convenience of explanation, repeated parts of contents explained using FIGS. 1 to 9 will be briefly explained or omitted.

Referring to FIG. 11, the semiconductor package 100b may include an electromagnetic wave shielding film 240. In an implementation, the electromagnetic wave shielding film 240 may be on the first redistribution layer 110. In an implementation, the electromagnetic wave shielding film 240 may extend along the side walls and the upper face of the first semiconductor chip 200. The electromagnetic wave shielding film 240 may surround the first semiconductor chip 200, and may be spaced apart from the first semiconductor chip 280.

The electromagnetic wave shielding film 240 may be surrounded by the encapsulator 150. In an implementation, after the electromagnetic wave shielding film 240 is formed on the first semiconductor chip 200, the encapsulator 150 may be formed on the electromagnetic wave shielding film 240.

The electromagnetic wave shielding film 240 may not be in contact with the first semiconductor chip 200 and the interconnector 300. In an implementation, the side walls of the electromagnetic wave shielding film 240 may be between the first semiconductor chip 200 and the interconnector 300.

The electromagnetic wave shielding film 240 may include a metallic material. The electromagnetic wave shielding film 240 may include, e.g., silver (Ag), aluminum (Al), copper (Cu), platinum (Pt), zinc (Zn), nickel (Ni), iron (Fe), or alloys thereof.

The electromagnetic wave shielding film 240 may be in contact with a ground region to ground and remove electromagnetic waves from the outside and inside of the first semiconductor chip 200, thereby blocking electromagnetic interference. As a result, the electromagnetic wave shielding film 240 may help prevent damage and malfunction of the semiconductor package 100*b* and may help ensure the operational reliability of the semiconductor package 100*b*.

In an implementation, the electromagnetic wave shielding film 240 may help remove electromagnetic waves from the first redistribution layer 110, the interconnector 300, the second redistribution layer 160, and the like so that the first semiconductor chip 200 is operated normally. In an implementation, the electromagnetic wave shielding film 240 may help remove electromagnetic waves from the first semiconductor chip 200 to ensure stability of the signal transmitted through the first redistribution layer 110, the interconnector 300, and the second redistribution layer 160.

Hereinafter, a semiconductor package 100*c* including a heat slug 250 will be explained referring to FIG. 12.

Figure 12:
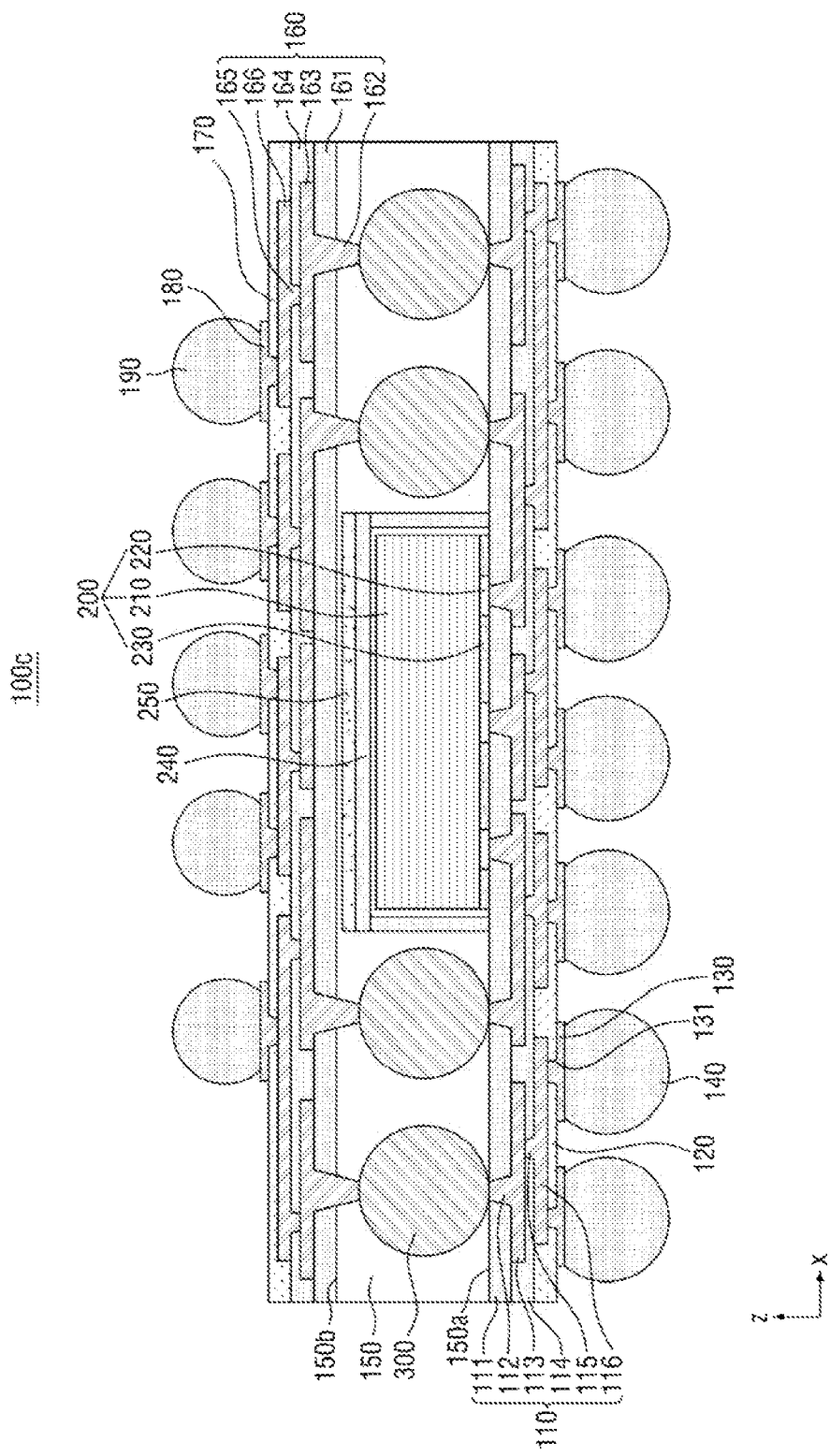
FIG. 12 is a cross-sectional view of a semiconductor package according to some embodiments of the present disclosure.

FIG. 12 is a cross-sectional view of a semiconductor package according to some embodiments of the present disclosure. For convenience of explanation, repeated parts of contents explained using FIGS. 1 to 9 and 11 will be briefly described or omitted.

Referring to FIG. 12, the semiconductor package 100*c* may further include a heat slug 250 (e.g., heat sink, heat disperser, or heat discharger). In an implementation, the heat slug 250 may be on the upper face of the electromagnetic wave shielding film 240. In an implementation, the heat slug 250 may be along the side faces and the upper face of the electromagnetic wave shielding film 240.

The heat slug 250 may include a metal, which is a material having a higher thermal conductivity than air. In an implementation, the heat slug 250 may include copper (Cu), iron (Fe), nickel (Ni), cobalt (Co), tungsten (W), chromium (Cr), silver (Ag), gold (Au), platinum (Pt), tin (Sn), aluminum (Al), magnesium (Mg), silicon (Si), zinc (Zn) or a combination thereof.

In an implementation, a thermal interface material (TIM) may be between the heat slug 250, the electromagnetic wave shielding film 240 and the first semiconductor chip 200. The thermal interface material may be, e.g., at least one metal material selected from silver (Ag), aluminum (Al), copper (Cu), platinum (Pt), zinc (Zn), nickel (Ni), and iron (Fe) or an alloy of the metal material.

The heat slug 250 may be above the first semiconductor chip 200 and the electromagnetic wave shielding film 240, and may help discharge heat generated from the first semiconductor chip 200.

Hereinafter, a semiconductor package 100*d* in which the encapsulator 150 does not cover the interconnector 300 and the upper face of the first semiconductor chip 200 will be explained referring to FIG. 13.

Figure 13:
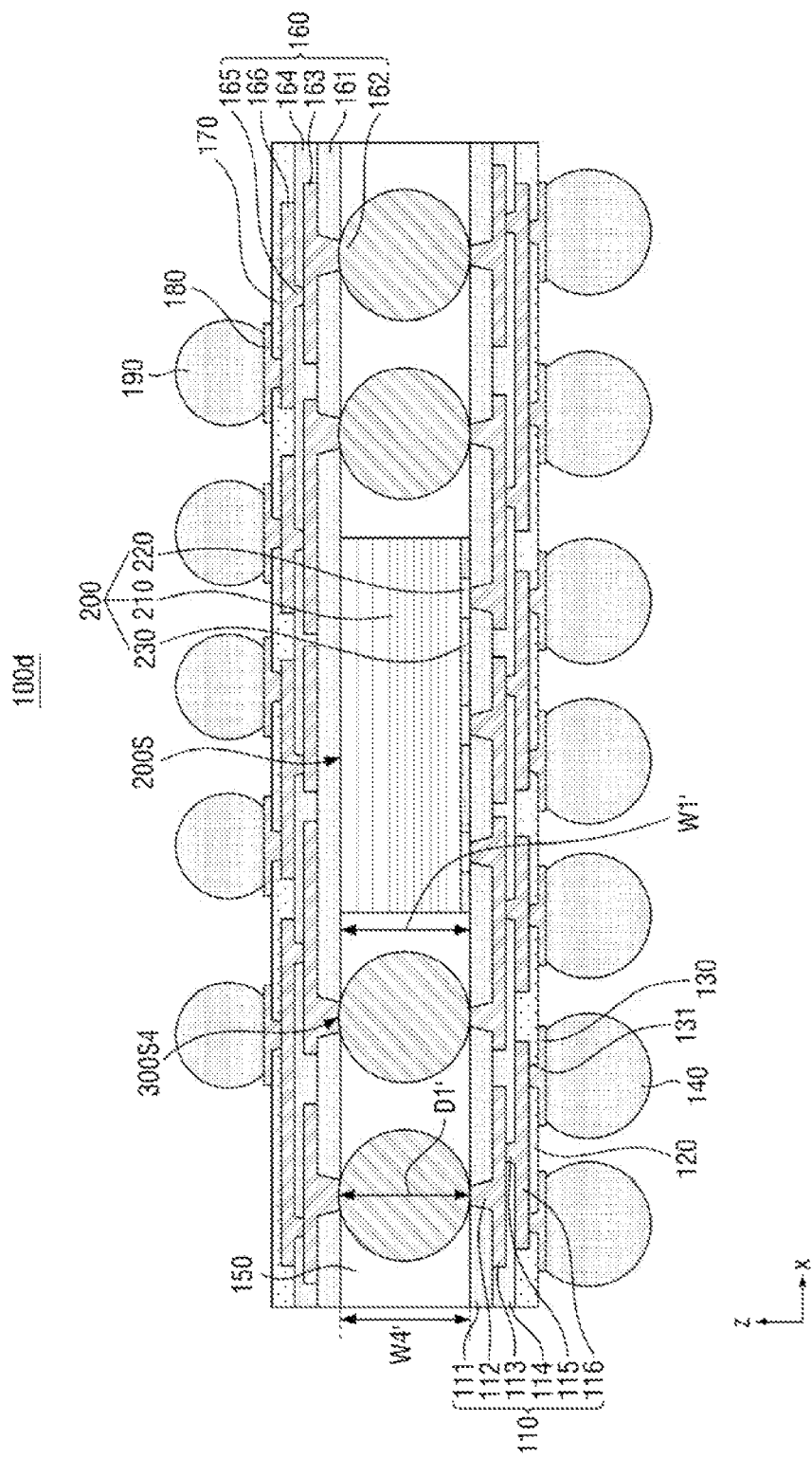
FIG. 13 is a cross-sectional view of a semiconductor package according to some embodiments of the present disclosure.

FIG. 13 is a cross-sectional view of a semiconductor package according to some embodiments of the present disclosure. For convenience of explanation, repeated parts of contents explained using FIGS. 1 to 9 will be briefly explained or omitted.

Referring to FIG. 13, an upper face 200S of the first semiconductor chip 200 and an upper face 300S4 of the interconnector 300 may be exposed to or at the upper face of the encapsulator 150. In an implementation, the encapsulator 150 may not cover a part of the upper side of the interconnector 300. In an implementation, the encapsulator 150 may not cover a part of the upper side of the first semiconductor chip 200. In an implementation, the encapsulator 150 may cover only the side walls of the first semiconductor chip 200.

The second redistribution layer 160 may be on an upper face 200S of the first semiconductor chip 200 and an upper face 300S4 of the interconnector 300. In an implementation, the upper face 200S of the first semiconductor chip 200 and the upper face 300S4 of the interconnector 300 may contact (e.g., directly contact) the second redistribution layer 160. In an implementation, the lower face of the second redistribution layer 160 may be in contact with the second face 150*b* of the encapsulator 150, the upper face 200S of the first semiconductor chip 200 and the upper face 300S4 of the interconnector 300. In an implementation, only the insulating layer 161 may be etched to form the via 162, and the encapsulator 150 may not be etched.

In an implementation, a first diameter D1' of the interconnector 300, a first thickness W1' of the first semiconductor chip 200 and a fourth thickness W4' of the encapsulator 150 may be substantially the same.

Hereinafter, a semiconductor package 100*e* on which a semiconductor package 400 is mounted will be explained referring to FIGS. 14 and 15.

Figure 14:
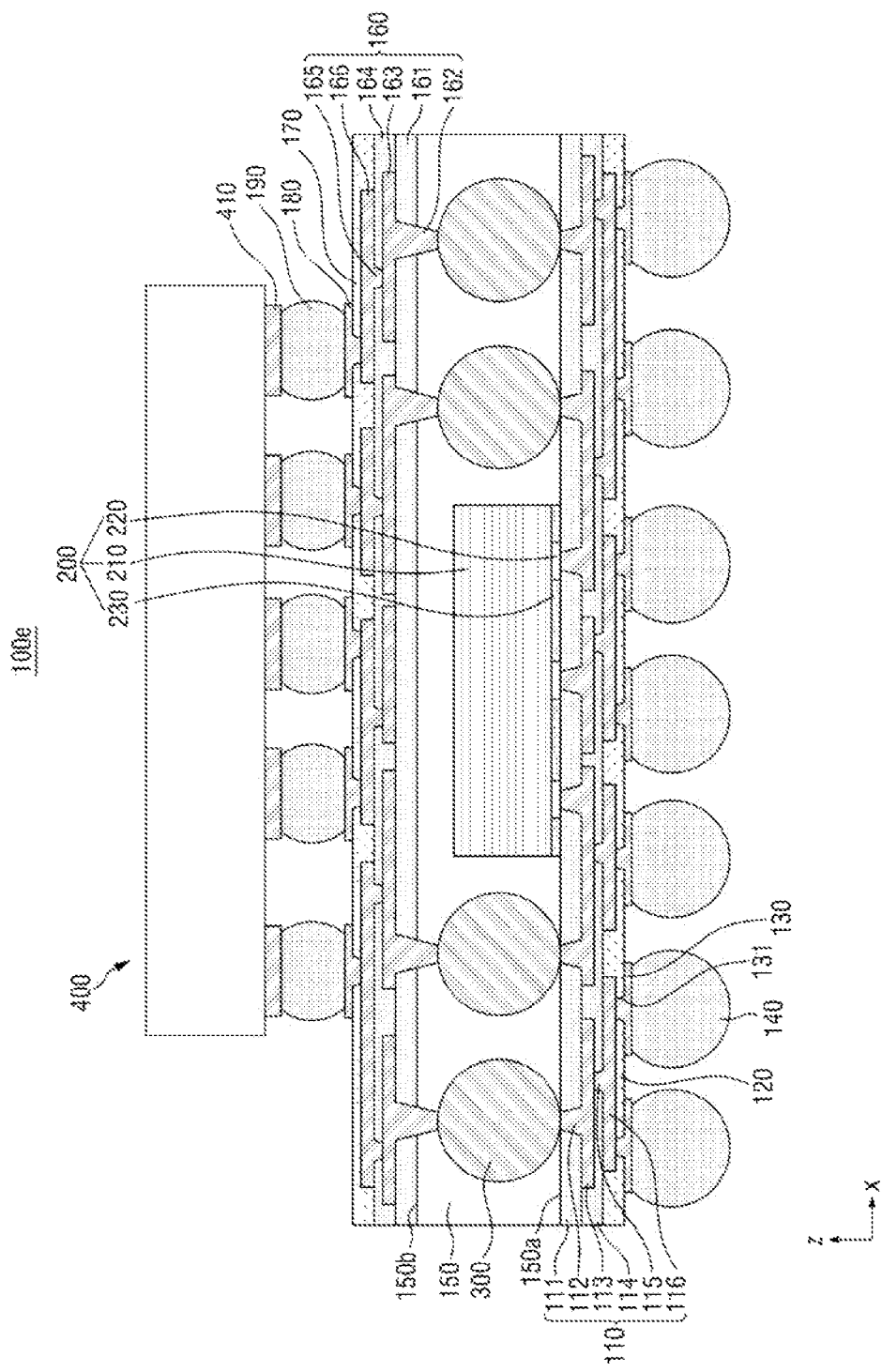
FIG. 14 is a cross-sectional view of a semiconductor package according to some embodiments of the present disclosure.

FIG. 14 is a cross-sectional view of a semiconductor package according to some embodiments of the present disclosure. FIG. 15 is a cross-sectional view of the semiconductor package according to some embodiments of the present disclosure. For convenience of explanation, repeated parts of contents explained using FIGS. 1 to 9 will be briefly explained or omitted.

Referring to FIG. 14, the semiconductor package 100*e* may further include a semiconductor package 400. In an implementation, the semiconductor package 400 may be on a connection terminal 190. In an implementation, the semiconductor package 400 may be on the second redistribution layer 160.

The semiconductor package 400 may include a second semiconductor chip and a connection pad 410. The second semiconductor chip may be mounted inside the semiconductor package 400. In an implementation, the second semiconductor chip may include a volatile memory chip such as a DRAM (Dynamic Random Access Memory) or an SRAM (Static RAM), or a non-volatile memory chip such as a PRAM (Phase-change RAM), a MRAM (Magneto resistive RAM), a FeRAM (Ferroelectric RAM) or a RRAM (Resistive RAM).

The second semiconductor chip may be electrically connected to the connection terminal 190 through the connection pad 410. The connection pad 410 may be physically and electrically connected to the connection terminal 190. The semiconductor package 400 may be electrically connected to the first semiconductor chip 200 through the connection terminal 190, the second redistribution layer 160, the interconnector 300, and the first redistribution layer 110. The first semiconductor chip 200 and the second semiconductor chip may transmit and receive signals through an electrical route.

The semiconductor package 100*e* may be a POP (package on package) in which the semiconductor package 400 is mounted on the semiconductor package. The connection pad 220 of the first semiconductor chip 200 may be redistributed through the first redistribution layer 110, the interconnector 300 and the second redistribution layer 160, and is connected to the second semiconductor chip, the semiconductor package 100e may mount more semiconductor chips in the same area.

Figure 15:
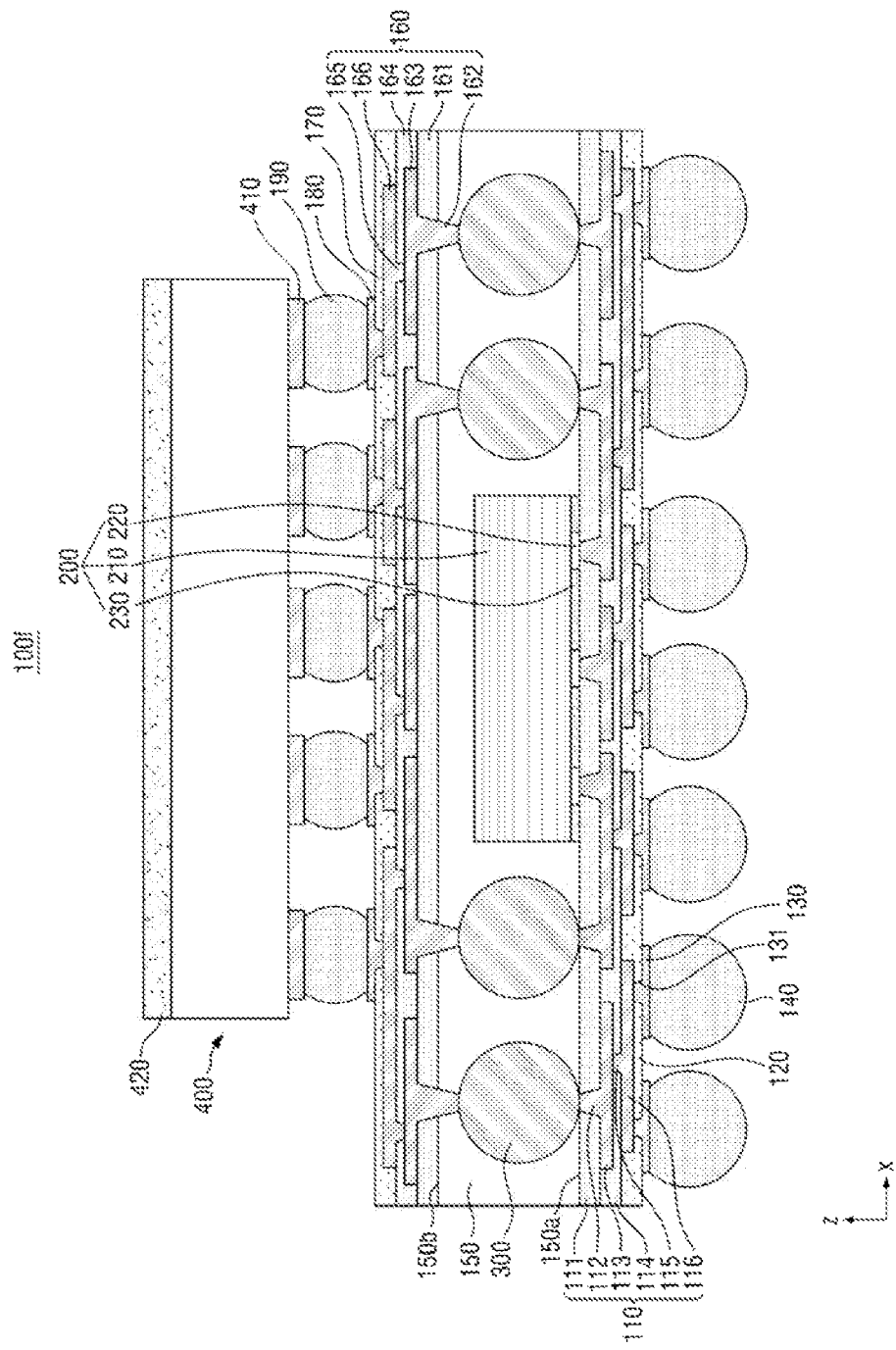
FIG. 15 is a cross-sectional view of the semiconductor package according to some embodiments of the present disclosure.

Referring to FIG. 15, the semiconductor package 100f may further include a heat slug 420. In an implementation, the heat slug 420 may be on the upper face of the semiconductor package 400. In an implementation, the heat slug 420 may be along the side faces and the upper face of the semiconductor package 400.

The heat slug 420 may include a metal, which is a material having a higher thermal conductivity than air. In an implementation, the heat slug 420 may include copper (Cu), iron (Fe), nickel (Ni), cobalt (Co), tungsten (W), chromium (Cr), silver (Ag), gold (Au), platinum (Pt), tin (Sn), aluminum (Al), magnesium (Mg), silicon (Si), zinc (Zn), or a combination thereof.

In an implementation, a thermal interface material (TIM) may be between the heat slug 420 and the semiconductor package 400. The thermal interface material may be, e.g., at least one metal material selected from silver (Ag), aluminum (Al), copper (Cu), platinum (Pt), zinc (Zn), nickel (Ni), and iron (Fe) or an alloy of the metal materials.

The heat slug 420 may be above the semiconductor package 400 and may discharge heat generated from the second semiconductor chip.

Hereinafter, a method for fabricating the semiconductor package 100e will be explained referring to FIGS. 16 to 28.

FIGS. 16 to 28 illustrate stages in a method for fabricating a semiconductor package according to some embodiments of the present disclosure.

Figure 16:
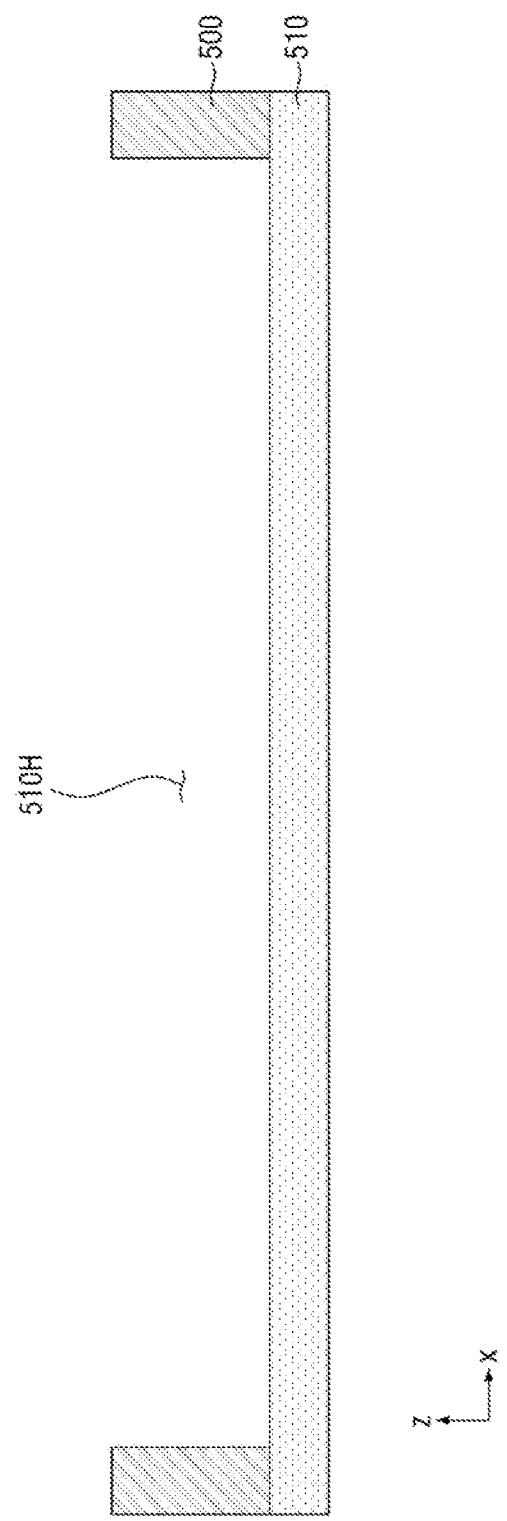
FIGS. 16 to 28 illustrate stages in a method for fabricating a semiconductor package according to some embodiments of the present disclosure.
Figure 17:
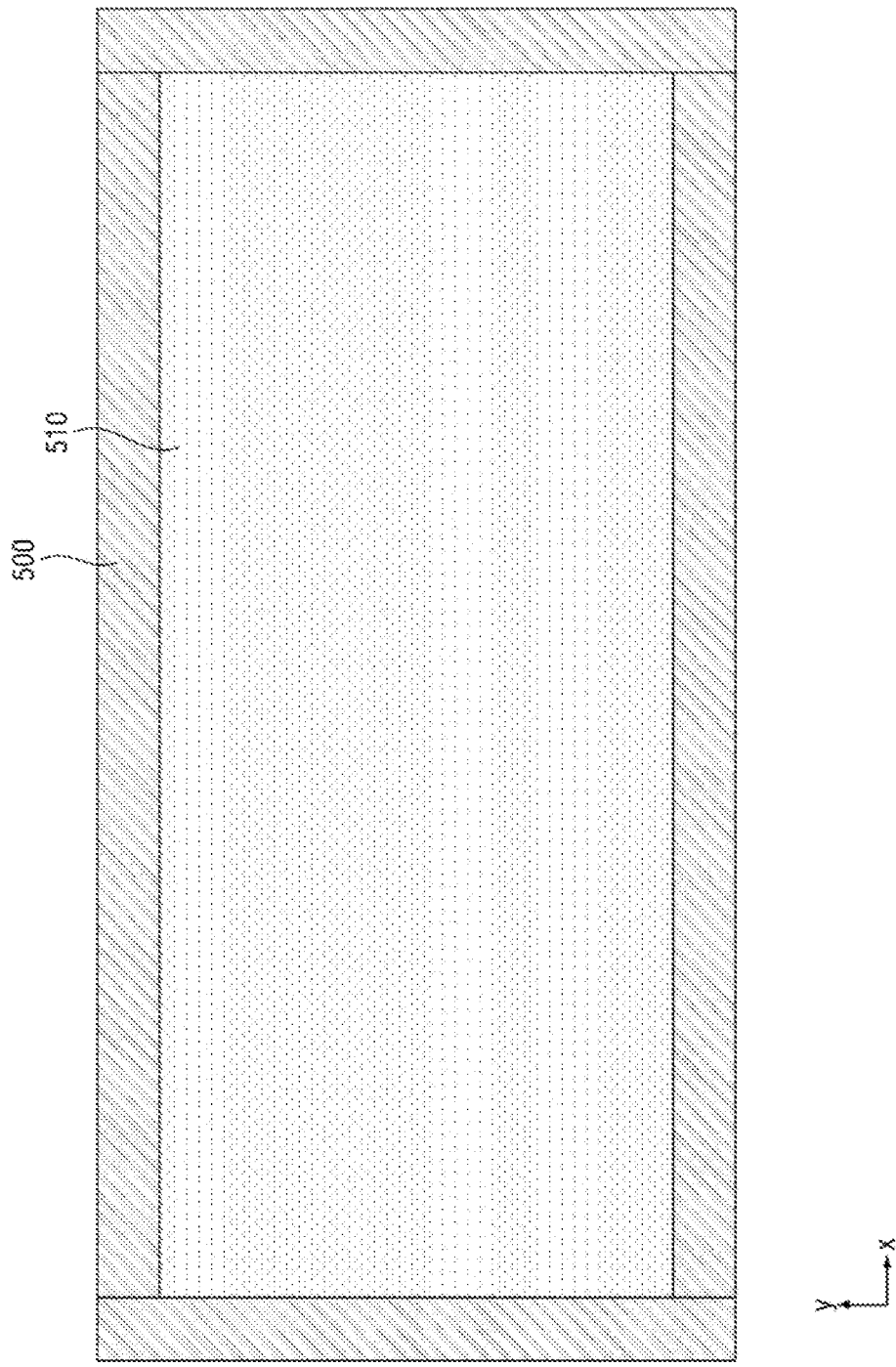

Referring to FIGS. 16 and 17, a metal frame 500 and an adhesive film 510 may be prepared. The metal frame 500 may be a frame having a thickness in the third direction Z, extending in a first direction X and a second direction Y, and having a hole in at the center. The metal frame 500 may include a metal material.

The adhesive film 510 may include tape or the like. In an implementation, the adhesive film 510 may include an ultraviolet curable adhesive tape whose adhesive force is weakened by ultraviolet rays, a heat treatment curable adhesive tape whose adhesive force is weakened by heat treatment, or the like. The adhesive film 510 may extend on a plane in the first direction X and the second direction Y.

The metal frame 500 may be attached to the adhesive film 510. The metal frame 500 may be on the adhesive film 510, and a region inside the metal frame 500 and over the adhesive film 510 may be defined as a hole 510H.

Figure 18:
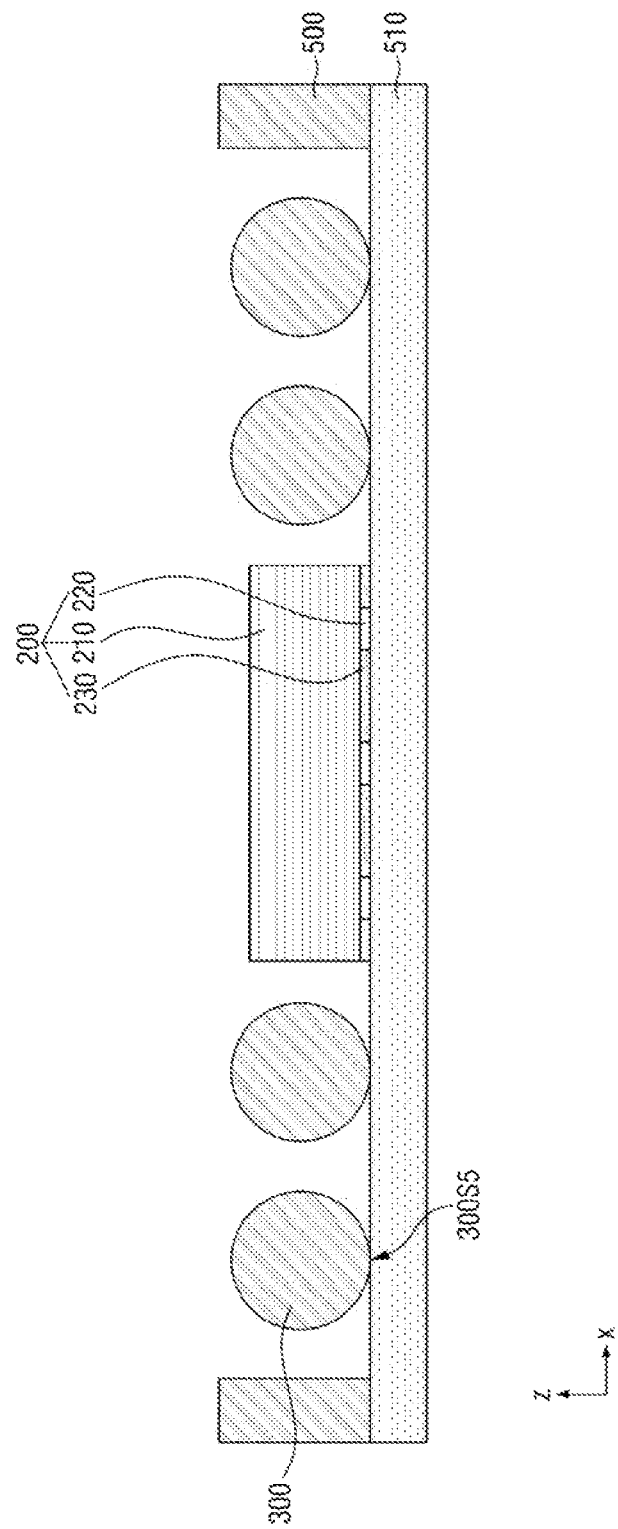

Referring to FIG. 18, the interconnector 300 and the first semiconductor chip 200 may be placed in the hole 510H surrounded by the metal frame 500. In an implementation, the first semiconductor chip 200 may be placed and glued on the central part of the adhesive film 510. In an implementation, the plurality of interconnectors 300 may be placed to surround the first semiconductor chip 200 and may be glued onto the adhesive film 510. The metal frame 500 and the interconnector 300 may be spaced apart from each other at regular intervals. In an implementation, the interconnector 300 and the first semiconductor chip 200 may be spaced from each other at regular intervals.

A lower face 300S5 of the interconnector 300 may be glued to the adhesive film 510, and the connection pad 220 of the first semiconductor chip 200 may be glued to the adhesive film 510.

Figure 19:
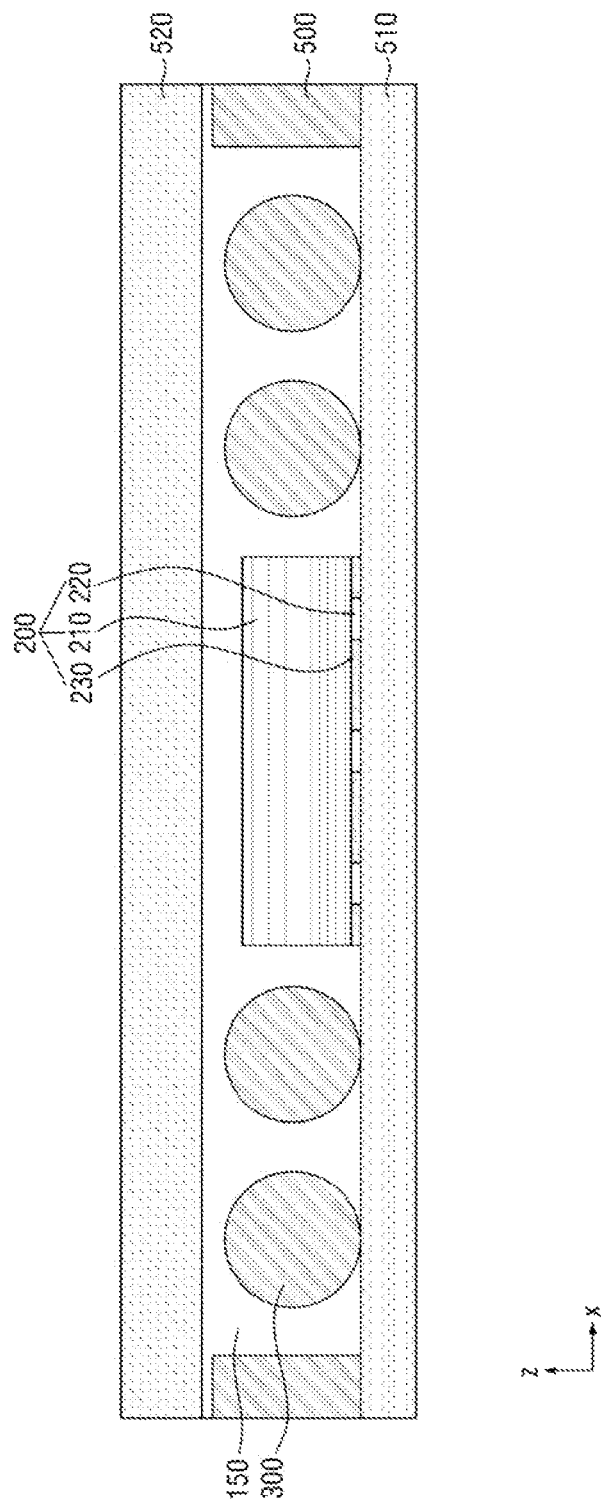

Referring to FIG. 19, the encapsulator 150 may encapsulate the first semiconductor chip 200 and the interconnector 300. The encapsulator 150 may encapsulate at least some of the first semiconductor chip 200 and the interconnector 300 and fill the hole 510H. In an implementation, the encapsulator 150 may fill all the (e.g., remaining) regions defined by the metal frame 500 and the adhesive film 510. The encapsulator 150 may also cover the metal frame 500.

In an implementation, the first semiconductor chip 200 and the interconnector 300 may be covered with the encapsulator 150. In an implementation, the encapsulator 150 may not cover some of the first semiconductor chip 200 and the interconnector 300.

The first carrier 520 may be attached onto the encapsulator 150. In an implementation, the first carrier 520 may include an insulating substrate. The first carrier 520 is attached to the upper face of the encapsulator 150 to allow the process to proceed.

Figure 20:
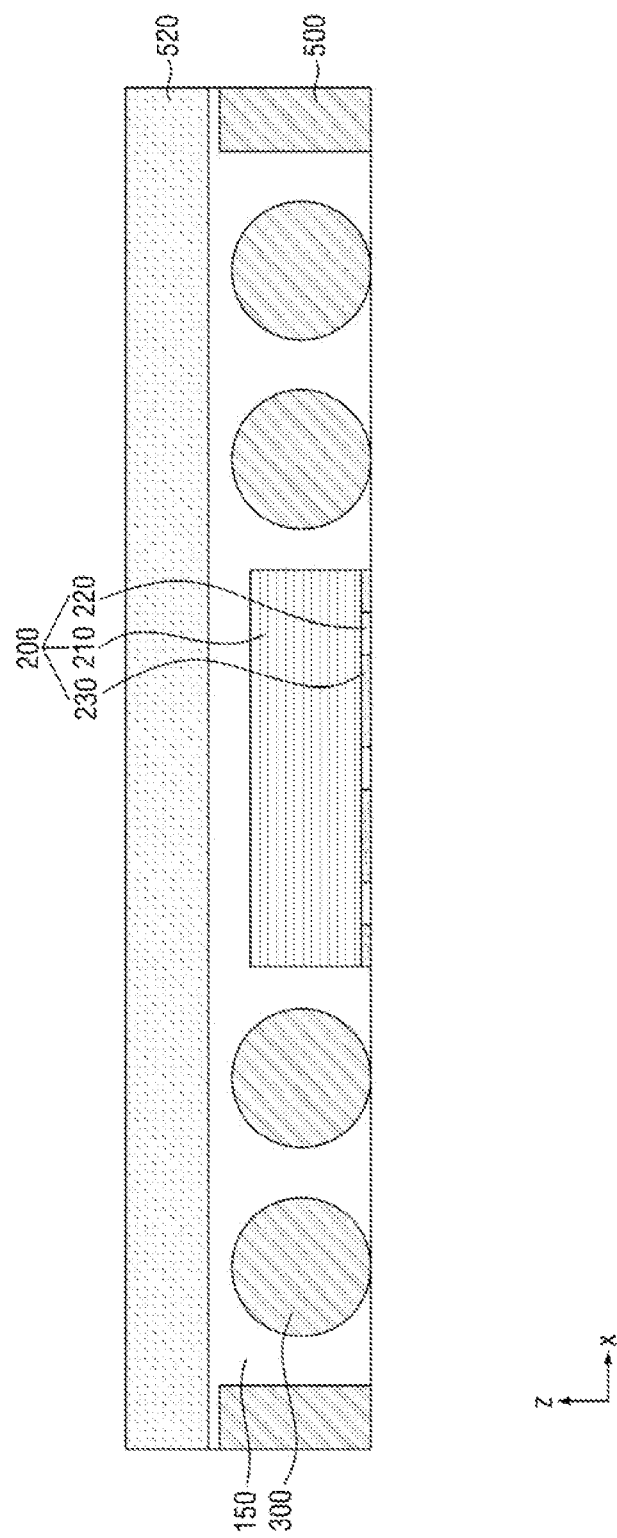

Referring to FIG. 20, the adhesive film 510 may be peeled off. In an implementation, the adhesive film 510 may be peeled off from the glued first semiconductor chip 200, the interconnector 300 and the metal frame 500.

In an implementation, when the adhesive film 510 is a heat-treated curable adhesive tape, the adhesive film 510 may be peeled off after being heat-treated to weaken the adhesive force. In an implementation, when the adhesive film 510 is an ultraviolet curable adhesive tape, the adhesive film 510 may be peeled off after being irradiated with ultraviolet rays to weaken the adhesive force.

Figure 21:
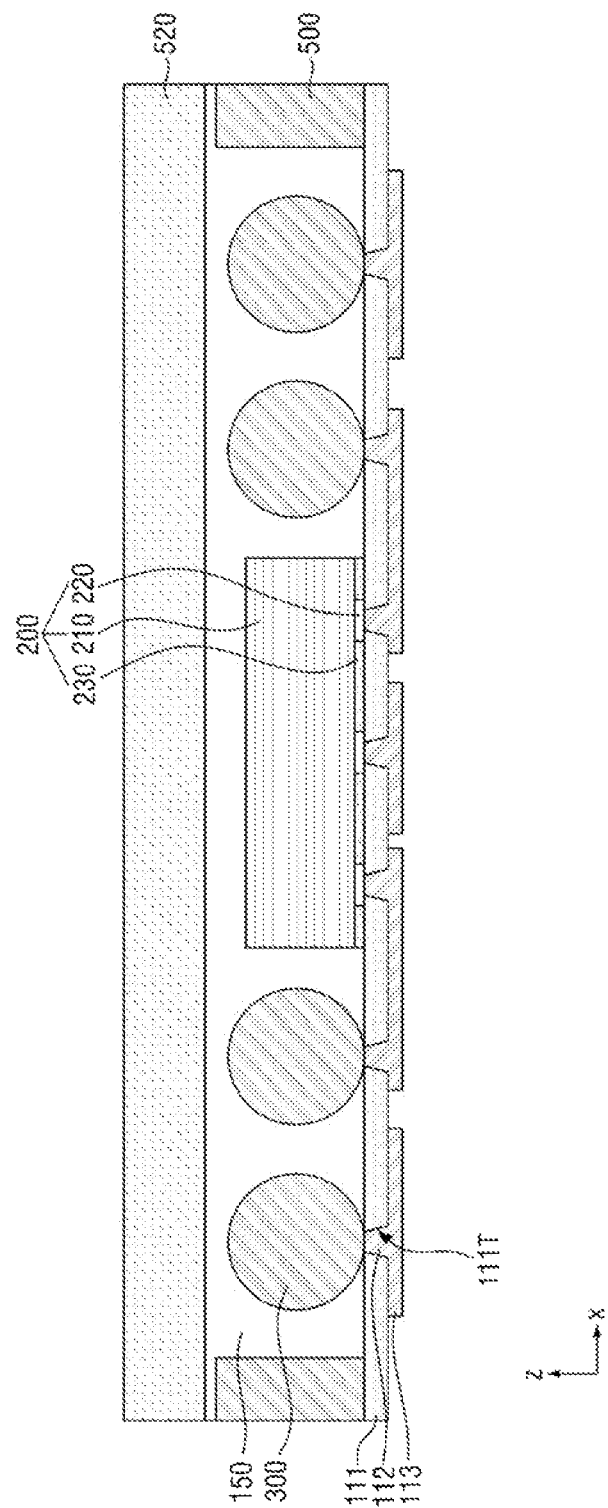

Referring to FIG. 21, the insulating layer 111, the via 112 and the line wiring 113 may be formed on the first semiconductor chip 200, the interconnector 300 and the encapsulator 150 from which the adhesive film 510 has been removed.

The insulating layer 111, the via 112 and the line wiring 113 may be formed on the first semiconductor chip 200 to redistribute the connection pad 220. In an implementation, the insulating layer 111, the via 112 and the line wiring 113 may be formed on the interconnector 300.

The insulating layer 111 may be an insulating material such as a photosensitive insulating resin (PID). The insulating layer 111 may be formed, and a trench 111T exposing the connection pad 220 and the interconnector 300 may be formed. The via 112 may be formed by filling the trench 111T, and the line wiring 113 may be formed on the via 112 and the insulating layer 111.

Figure 22:
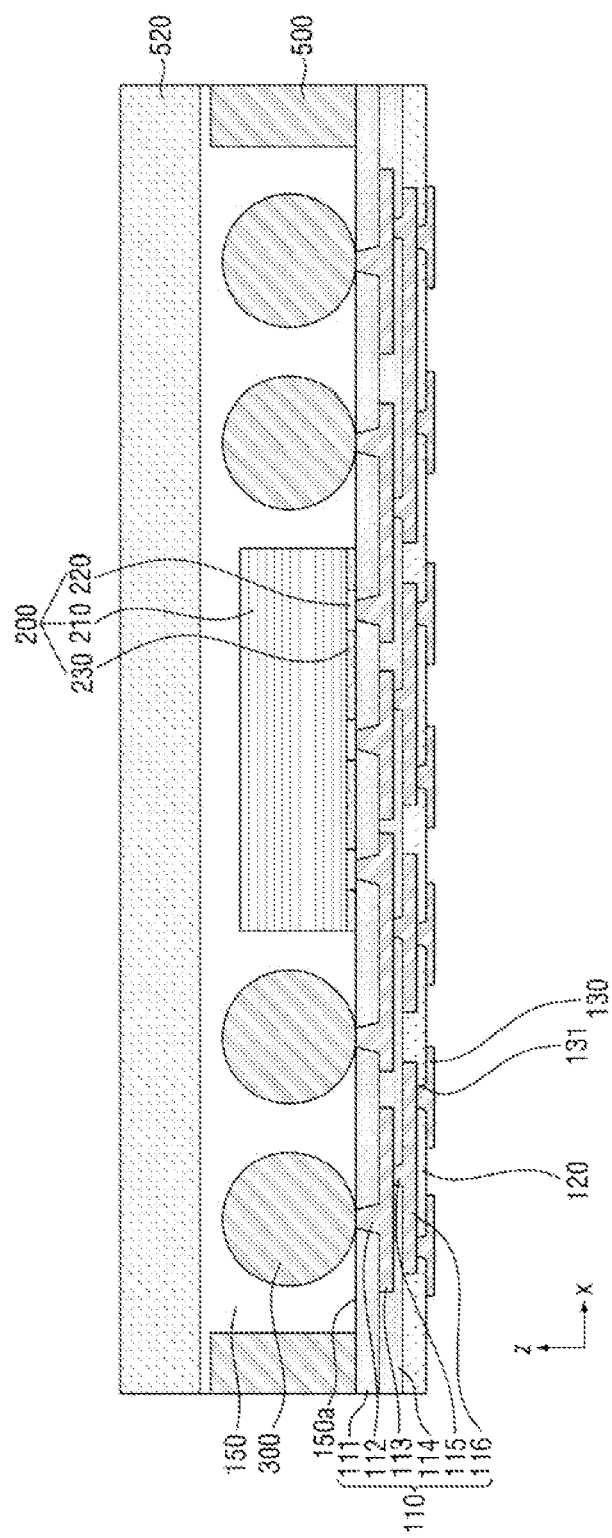

Referring to FIG. 22, the insulating layer 114, the via 115 and the line wiring 116 may be formed on the insulating layer 111, the via 112 and the line wiring 113. The insulating layer 114, the via 115 and the line wiring 116 may be formed in the same manner as the insulating layer 111, the via 112 and the line wiring 113. As a result, the first redistribution layer 110 including the insulating layer 111, the via 112, the line wiring 113, the insulating layer 114, the via 115 and the line wiring 116 may redistribute the connection pad 220 and the interconnector 300.

A passivation layer 120 may be formed on the first redistribution layer 110. The passivation layer 120 may help protect the first redistribution layer 110.

An opening 131 may be formed in the passivation layer 120, and the line wiring 116 may be exposed. An underbump metal layer 130 may be formed on the exposed line wiring 116 and the passivation layer 120.

At this time, a region in which the first redistribution layer 110, the passivation layer 120, and the underbump metal layer 130 are formed, may be wider than a region in which the connection pad 220 of the first semiconductor chip 200 is placed. In an implementation, the connection pad 220 of the first semiconductor chip 200 may be redistributed in a wider region through the first redistribution layer 110.

Figure 23:
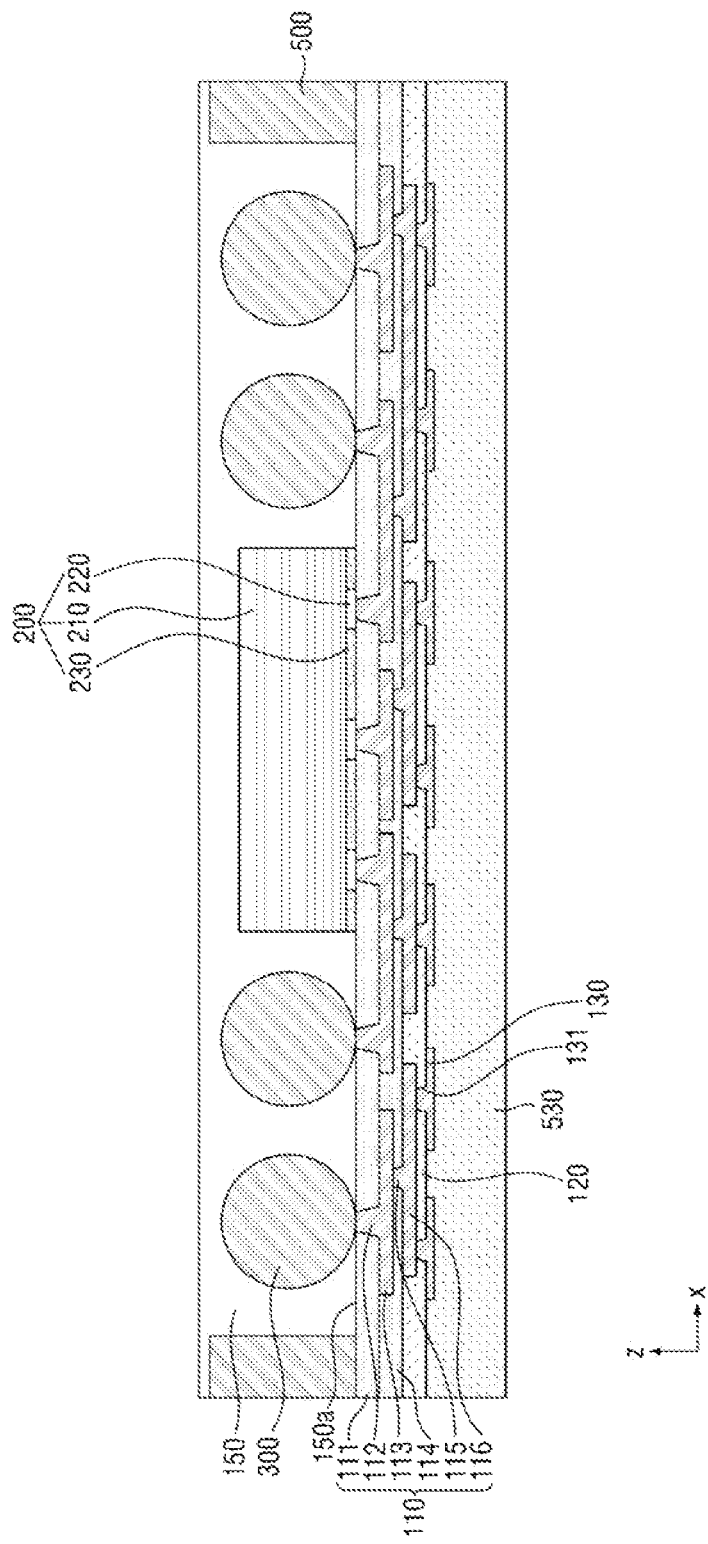

Referring to FIG. 23, the first carrier 520 may be peeled off. In an implementation, the first carrier 520 may be peeled off from the glued encapsulator 150. After that, the second carrier 530 may be attached to the lower part of the first redistribution layer 110, the passivation layer 120, and the underbump metal layer 130. In an implementation, the second carrier 530 may include an insulating substrate. The second carrier 530 may be attached to the lower faces of the passivation layer 120 and the underbump metal layer 130 to allow the process to proceed.

Figure 24:
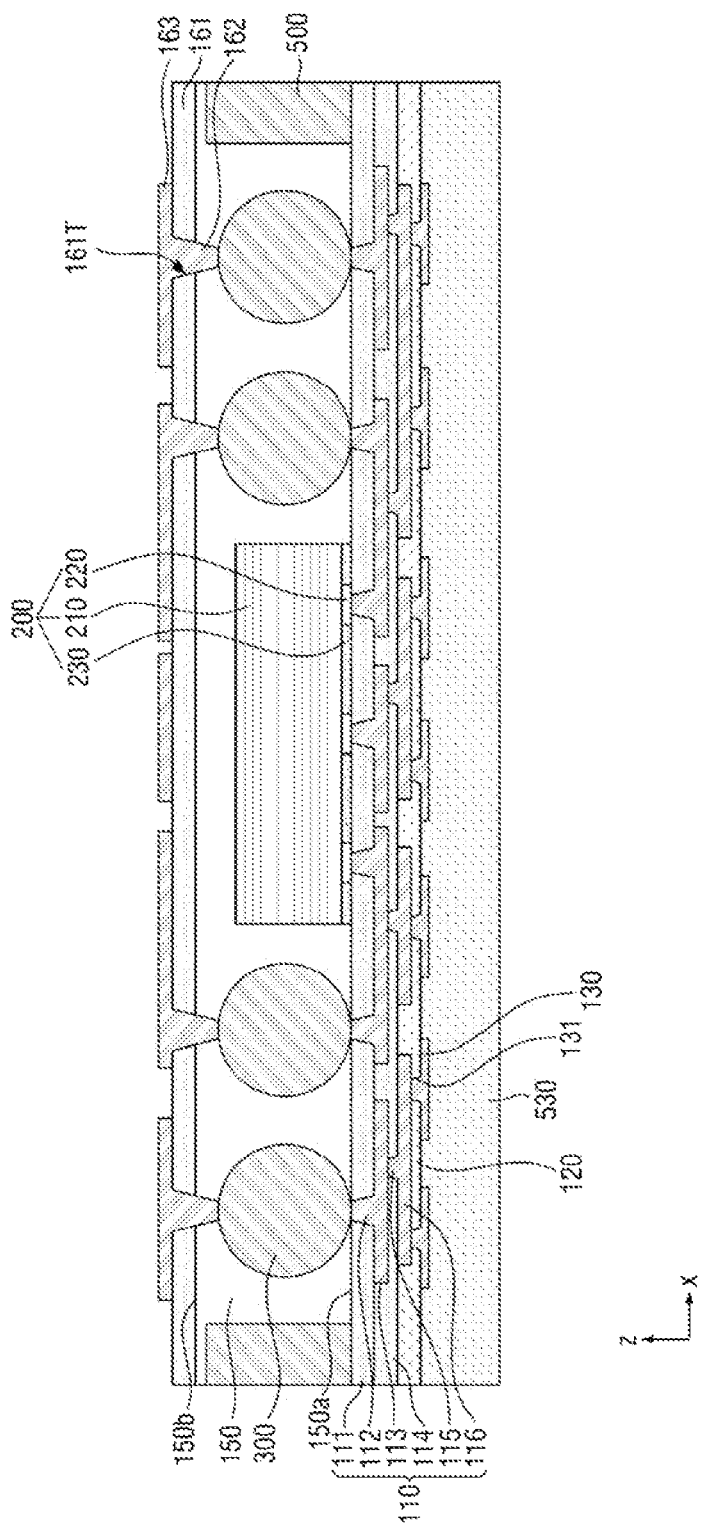

Referring to FIG. 24, the insulating layer 161, the via 162 and the line wiring 163 may be formed on the encapsulator 150. The insulating layer 161 may be formed to cover the encapsulator 150. In an implementation, the insulating layer 161 may cover the encapsulator 150, the first semiconductor chip 200, and the interconnector 300.

A trench 161T that penetrates the insulating layer 161, pierces the encapsulator 150 and extends to the upper face of the interconnector 300 may be formed. The side walls of the trench 161T may include both the insulating layer 161 and the encapsulator 150, and the lower face of the trench 161T may include or reach the interconnector 300. The trench 161T may expose the interconnector 300.

The via 162 may be formed to fill the trench 161T. The via 162 may be in contact with the interconnector 300. A part of the via 162 may be formed inside the insulating layer 161 and the other part of the via 162 may be formed inside the encapsulator 150. The via 162 may physically and electrically connect the interconnector 300 and the line wiring 163. The line wiring 163 may be formed on the via 162 and the insulating layer 161.

Figure 25:
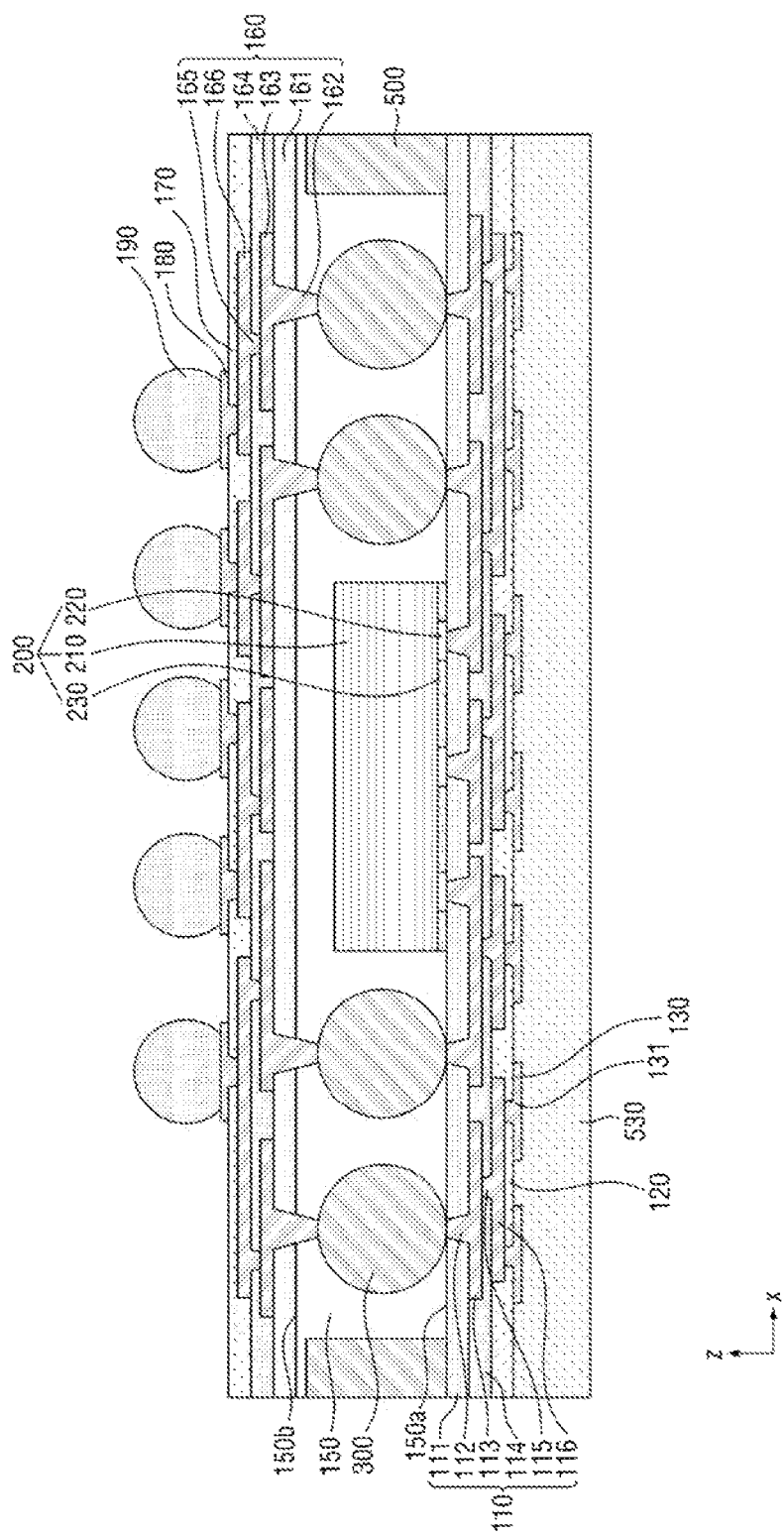

Referring to FIG. 25, the insulating layer 164, the via 165 and the line wiring 166 may be formed on the insulating layer 161, the via 162 and the line wiring 163. The insulating layer 164, the via 165 and the line wiring 166 may be formed in the same manner as the insulating layer 161, the via 162 and the line wiring 163. As a result, the second redistribution layer 160 including the insulating layer 161, the via 162, the line wiring 163, the insulating layer 164, the via 165 and the line wiring 166 may redistribute the connection pad 220 and the interconnector 300.

A passivation layer 170 may be formed on the second redistribution layer 160. The passivation layer 170 may protect the second redistribution layer 160.

An opening may be formed in the passivation layer 170 and the line wiring 166 may be exposed. An underbump metal layer 180 may be formed on the open line wiring 166 and passivation layer 170. A connection terminal 190 may be connected onto the underbump metal layer 180.

Figure 26:
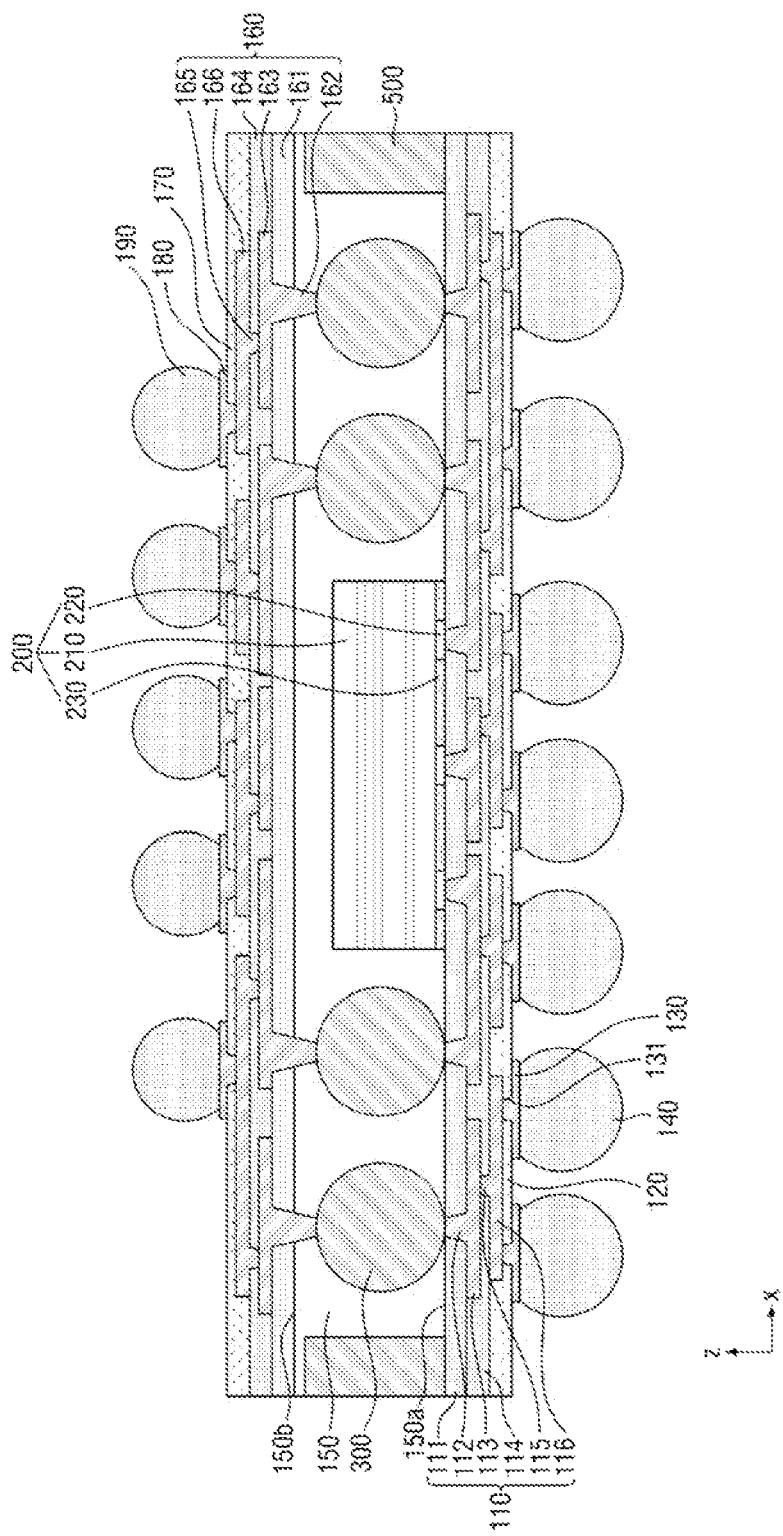

Referring to FIG. 26, the second carrier 530 may be peeled off. In an implementation, the second carrier 530 may be peeled off from the glued passivation layer 120 and underbump metal layer 180.

The connection terminal 140 may be connected onto the underbump metal layer 180. In an implementation, at least one of the plurality of connection terminals 140 may be placed in the fan-out region. As a result, the semiconductor package 100e may be a fan-out semiconductor package.

Figure 27:
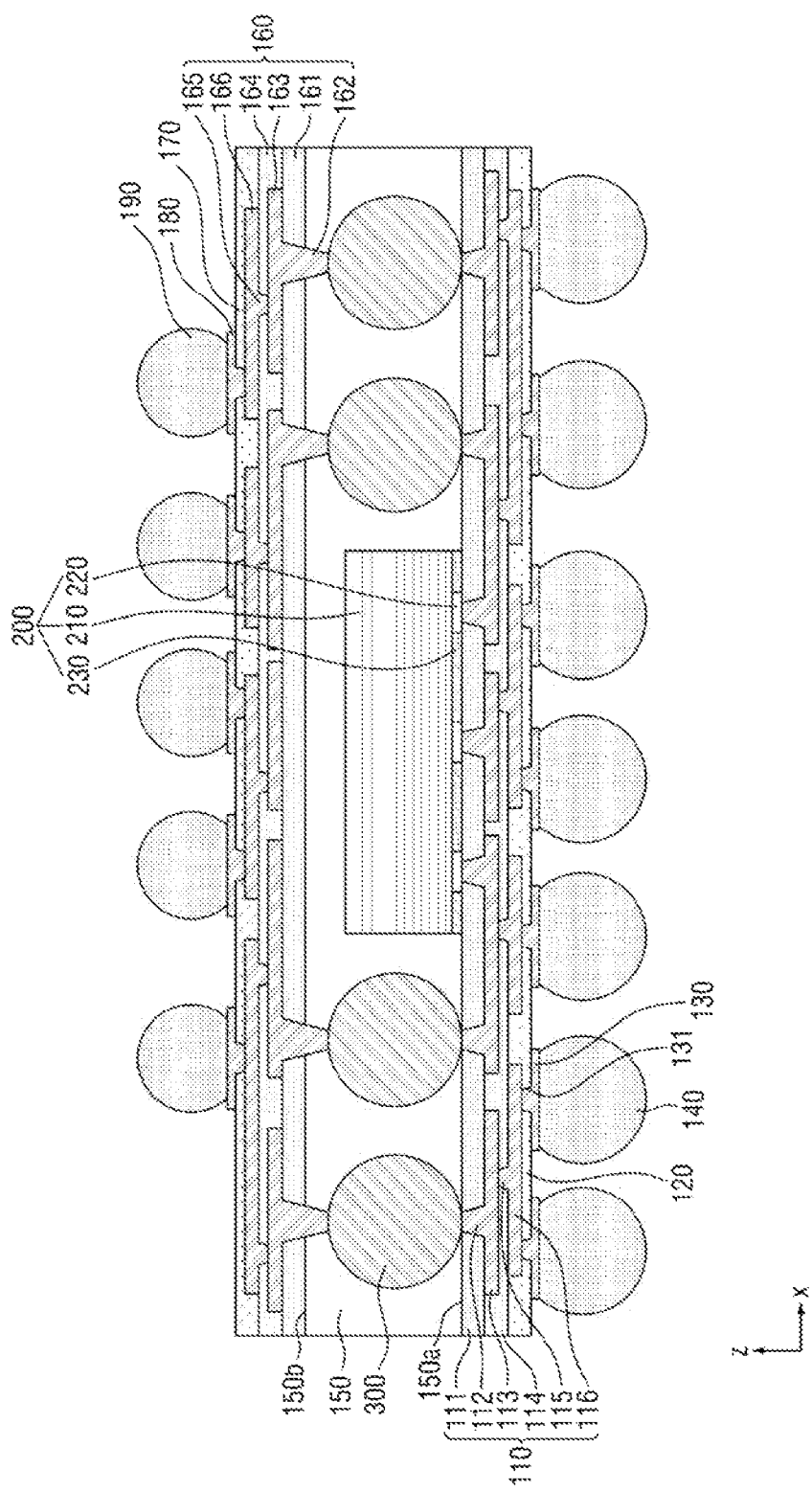

Referring to FIG. 27, the semiconductor package 100e corresponding to the region of the metal frame 500 and the metal frame 500 may be removed. In an implementation, the semiconductor package 100e corresponding to the region of the metal frame 500 and the metal frame 500 may be sawed. As a result, the semiconductor package 100e may be subjected to singulation.

In an implementation, the interval between the metal frame 500 and the outermost interconnector 300 and the connection terminal 140 may be small, and an amount of semiconductor package 100e to be sawn may be reduced.

Figure 28:
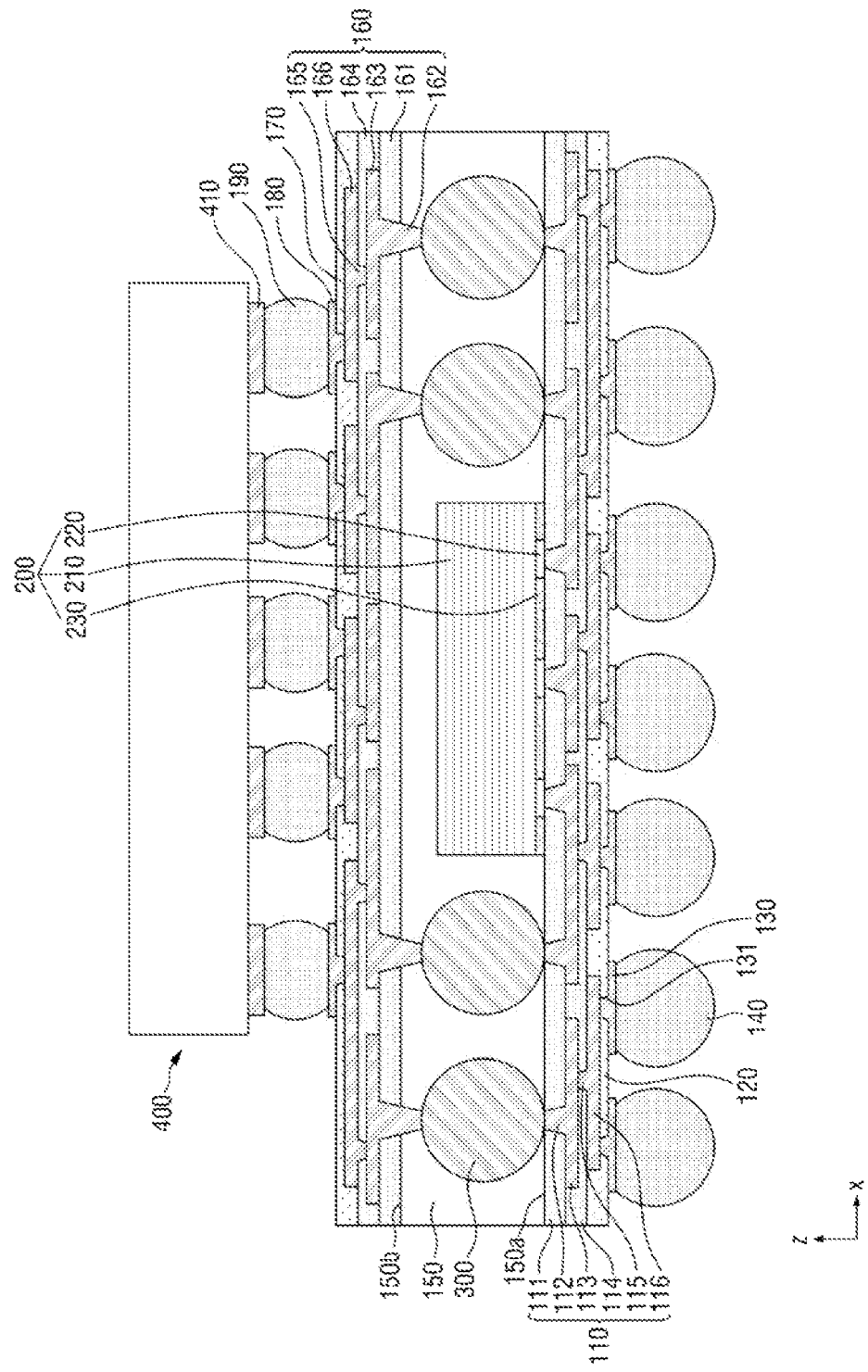

Referring to FIG. 28, the semiconductor package 400 may be mounted on the connection terminal 190. In an implementation, the connection pad 410 of the semiconductor package 400 may be connected to the connection terminal 190. The semiconductor package 400 may include a second semiconductor chip different from the first semiconductor chip 200, and the first semiconductor chip 200 and the second semiconductor chip may be electrically connected through the first redistribution layer 110, the interconnector 300 and the second redistribution layer 160.

By way of summation and review, one package technique is a fan-out semiconductor package. The fan-out semiconductor package is able to implement a large number of pins while having a small size, by also redistributing a connection terminal outside a region in which the semiconductor chip is placed.

One or more embodiments may provide a fan-out semiconductor package that uses a metal ball as an interconnector.

One or more embodiments may provide a fan-out semiconductor package that uses a metal ball as an interconnector to improve process performance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A fan-out semiconductor package, comprising:
 a first redistribution layer;
 a first semiconductor chip on the first redistribution layer;
 an interconnector on the first redistribution layer and spaced apart from the first semiconductor chip;
 a molded layer covering the interconnector and side surfaces of the first semiconductor chip; and
 a second redistribution layer on the molded layer,
 wherein:
 the interconnector includes a metal ball that has a full spherical shape and is electrically connected to the first redistribution layer,
 the second redistribution layer includes a first line wiring, and a first via electrically connected to the first line wiring,
 the first via is connected to the interconnector,
 a part of the first via is in the molded layer,
 the first redistribution layer includes an insulating layer, a second line wiring, and a second via that penetrates the insulating layer and is electrically connected to the second line wiring,
 the second via is connected to the interconnector,
 an interface between the first via and the interconnector is a curved surface such that the first via has a rounded concavity that is complementary to the full spherical shape of the interconnector, and an interface between the second via and the interconnector is a curved surface such that the second via has a rounded concavity that is complementary to the full spherical shape of the interconnector.

2. The fan-out semiconductor package as claimed in claim 1, wherein:
the interconnector is electrically connected to the first line wiring through the first via and electrically connected to the second line wiring through the second via, and
the first semiconductor chip is electrically connected to the first line wiring.

3. The fan-out semiconductor package as claimed in claim 1, wherein a diameter of the interconnector is smaller than a thickness of the molded layer.

4. The fan-out semiconductor package as claimed in claim 3, wherein a sum of a thickness of the first via and the diameter of the interconnector is greater than the thickness of the molded layer.

5. The fan-out semiconductor package as claimed in claim 1, wherein:
the interconnector further includes a coating layer thereon, the coating layer coating the metal ball, and the coating layer is in contact with the first via.

6. The fan-out semiconductor package as claimed in claim 5, wherein the coating layer includes a solder.

7. The fan-out semiconductor package as claimed in claim 1, further comprising an electromagnetic wave shielding film that extends along an upper surface and side walls of the first semiconductor chip and is spaced apart from the interconnector.

8. The fan-out semiconductor package as claimed in claim 7, further comprising a heat slug that extends along an upper surface of the electromagnetic shielding film.

9. The fan-out semiconductor package as claimed in claim 1, wherein a diameter of the interconnector is substantially the same as a thickness of the first semiconductor chip.

10. The fan-out semiconductor package as claimed in claim 9, wherein an upper surface of the first semiconductor chip is in contact with the second redistribution layer.

11. The fan-out semiconductor package as claimed in claim 1, further comprising a semiconductor package on the second redistribution layer and electrically connected to the first line wiring of the second redistribution layer,
wherein:
the semiconductor package includes a second semiconductor chip different from the first semiconductor chip, and
the second semiconductor chip is electrically connected to the first semiconductor chip through the second redistribution layer, the interconnector, and the first redistribution layer.

12. The fan-out semiconductor package as claimed in claim 11, further comprising a heat slug that extends along an upper surface of the semiconductor package.

13. The fan-out semiconductor package as claimed in claim 1, wherein the fan-out semiconductor package is a fan-out panel level package.

14. A fan-out semiconductor package, comprising:
a molded layer including first and second surfaces opposite to each other;
an interconnector in the molded layer, the interconnector including a metal ball that has a full spherical shape;
a semiconductor chip in the molded layer and spaced apart from the interconnector;
a first redistribution layer including a first line wiring and a first via on the first surface of the molded layer; and
a second redistribution layer on the second surface of the molded layer and including a second line wiring and a second via,
wherein:
the interconnector is between the first via and the second via and connected to the first via and the second via,
an interface between the first via and the interconnector is a curved surface such that the first via has a rounded concavity that is complementary to the full spherical shape of the interconnector, and an interface between the second via and the interconnector is a curved surface such that the second via has a rounded concavity that is complementary to the full spherical shape of the interconnector.

15. The fan-out semiconductor package as claimed in claim 14, wherein a part of the first via is in the molded layer.

16. A fan-out semiconductor package, comprising:
a first redistribution layer including a first line wiring and a first via connected to the first line wiring;
a first semiconductor chip on the first redistribution layer;
an interconnector on the first redistribution layer and spaced apart from the first semiconductor chip;
a molded layer covering the interconnector and covering side surfaces of the first semiconductor chip;
a second redistribution layer on the molded layer, the second redistribution layer including a second line wiring and a second via connected to the second line wiring; and
a semiconductor package that includes a second semiconductor chip on the second redistribution layer and connected to the second line wiring,
wherein:
the interconnector includes a metal ball that has a full spherical shape,
the first via is in contact with the interconnector,
the second via is in contact with the interconnector,
a part of the second via is inside the molded layer,
the first semiconductor chip is electrically connected to the second semiconductor chip through the first line wiring, the first via, the interconnector, the second via, and the second line wiring,
an interface between the first via and the interconnector is a curved surface such that the first via has a rounded concavity that is complementary to the full spherical shape of the interconnector, and
an interface between the second via and the interconnector is a curved surface such that the second via has a rounded concavity that is complementary to the full spherical shape of the interconnector.

* * * * *